(12) United States Patent
Song et al.

(10) Patent No.: US 12,727,498 B2
(45) Date of Patent: Sep. 1, 2026

(54) SEMICONDUCTOR PACKAGE AND METHOD OF MANUFACTURING THE SEMICONDUCTOR PACKAGE

(71) Applicant: Samsung Electronics Co., Ltd., Suwon-si (KR)

(72) Inventors: Solji Song, Suwon-si (KR); Byeongchan Kim, Asan-si (KR); Jumyong Park, Cheonan-si (KR); Jinho An, Seoul (KR); Chungsun Lee, Asan-si (KR); Jeonggi Jin, Seoul (KR); Juil Choi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 29 days.

(21) Appl. No.: 18/677,075

(22) Filed: May 29, 2024

(65) Prior Publication Data

US 2024/0312923 A1 Sep. 19, 2024

Related U.S. Application Data

(63) Continuation of application No. 17/198,359, filed on Mar. 11, 2021, now Pat. No. 12,021,034.

(30) Foreign Application Priority Data

Aug. 18, 2020 (KR) ........................ 10-2020-0103126

(51) Int. Cl.
*H01L 23/538* (2006.01)
*H01L 23/00* (2006.01)
(Continued)

(52) U.S. Cl.
CPC .......... *H10W 70/65* (2026.01); *H10W 70/611* (2026.01); *H10W 70/685* (2026.01); *H10W 90/00* (2026.01); *H10W 90/724* (2026.01)

(58) Field of Classification Search
CPC ................ H10W 70/65; H10W 70/685; H01L 23/5386; H01L 23/5383; H01L 23/3128; H01L 25/50; H01L 21/4857; H01L 24/97
See application file for complete search history.

(56) References Cited

U.S. PATENT DOCUMENTS 953,685 A 4/1910 Bradford
6,756,687 B1 6/2004 Nguyen
(Continued)

FOREIGN PATENT DOCUMENTS

JP 2006-156937 A 6/2006
JP 2015-534287 A 11/2015
KR 10-2020-0068958 A 6/2020

OTHER PUBLICATIONS

Office Action for Korean Application No. 10-2020-0103126 dated Jan. 13, 2025.

*Primary Examiner* — Lawrence C Tynes, Jr.
(74) *Attorney, Agent, or Firm* — Harness, Dickey & Pierce, P.L.C.

(57) ABSTRACT

A semiconductor package includes an interposer having a first surface and a second surface opposite to the first surface and including a plurality of bonding pads, and first and second semiconductor devices on the interposer. Each of the plurality of bonding pads includes a first pad pattern provided to be exposed from the first surface and having a first width and a second pad pattern provided on the first pad pattern and having a second width greater than the first width.

20 Claims, 18 Drawing Sheets

(51) Int. Cl.

| | |
|---|---|
| ***H01L 25/065*** | (2023.01) |
| ***H10W 70/60*** | (2026.01) |
| ***H10W 70/65*** | (2026.01) |
| ***H10W 70/685*** | (2026.01) |
| ***H10W 90/00*** | (2026.01) |

(56) References Cited

U.S. PATENT DOCUMENTS 8,154,123 B2 4/2012 Kondou et al.
8,338,286 B2 12/2012 Perfecto et al.
9,000,586 B2 4/2015 Do et al.
9,048,125 B2 6/2015 Paek et al.
9,391,043 B2 7/2016 Paek et al.
9,418,922 B2 8/2016 Paek et al.
9,449,946 B2 9/2016 Sung et al.
9,484,331 B2 11/2016 Paek et al.
9,543,242 B1 1/2017 Kelly et al.
9,607,919 B2 3/2017 Lee et al.
9,633,939 B2 4/2017 Kim et al.
9,653,428 B1 5/2017 Hiner et al.
9,704,842 B2 7/2017 Lee et al.
9,728,514 B2 8/2017 Paek et al.
9,799,592 B2 10/2017 Huemoeller et al.
9,818,684 B2 11/2017 Hiner et al.
9,818,708 B2 11/2017 Lee et al.
9,852,976 B2 12/2017 Kelly et al.
9,966,276 B2 5/2018 Do et al.
10,032,740 B2 7/2018 Paek et al.
10,032,748 B2 7/2018 Hiner et al.
10,074,630 B2 9/2018 Kelly et al.
10,163,832 B1* 12/2018 Huang .............. H01L 23/49811
10,192,816 B2 1/2019 Kelly et al.
10,269,744 B2 4/2019 Lee et al.
10,297,466 B2 5/2019 Do et al.
10,312,220 B2 6/2019 Hiner et al.
10,497,674 B2 12/2019 Hiner et al.
10,672,740 B2 6/2020 Kelly et al.
10,679,952 B2 6/2020 Paek et al.
10,833,002 B2 11/2020 Kim
2003/0216039 A1 11/2003 Wang et al.
2008/0272488 A1 11/2008 Miyata et al.
2011/0104888 A1 5/2011 Kim et al.
2014/0124949 A1 5/2014 Paek et al.
2015/0255426 A1 9/2015 Son et al.
2015/0325546 A1 11/2015 Hwang et al.
2017/0141087 A1 5/2017 Vincent et al.
2017/0221859 A1* 8/2017 Chen ..................... H10W 90/00
2018/0269145 A1 9/2018 Paek et al.
2018/0366432 A1 12/2018 Paek et al.
2019/0189552 A1 6/2019 Kelly et al.
2019/0279881 A1 9/2019 Do et al.
2020/0013739 A1 1/2020 Lee et al.
2020/0098720 A1 3/2020 Yu et al.
2020/0185314 A1* 6/2020 Kim .................. H01L 23/49822
2020/0227385 A1 7/2020 Hiner et al.
2021/0028134 A1 1/2021 Gerber
2021/0066149 A1 3/2021 Park et al.
2021/0407920 A1* 12/2021 Chen ................... H01L 23/3142
2022/0051959 A1 2/2022 Lee et al.

* cited by examiner 430
212c
212b
212a
210
270
400
410
310
300
500
330
240
200
222b
222a
222
230

12
201
430
210
250
260
280
290
100
130
270
300
410
310
E
330
240
230

SEMICONDUCTOR PACKAGE AND METHOD OF MANUFACTURING THE SEMICONDUCTOR PACKAGE

PRIORITY STATEMENT

This is a continuation of U.S. application Ser. No. 17/198,359, filed on Mar. 11, 2021, which claims priority to Korean Patent Application No. 10-2020-0103126, filed on Aug. 18, 2020, the disclosures of each of which are hereby incorporated by reference in their entirety.

BACKGROUND

1. Field

Example embodiments relate to semiconductor packages and methods of manufacturing the semiconductor package. More particularly, example embodiments relate to semiconductor packages including a plurality of different semiconductor devices stacked through an interposer and methods of manufacturing the same.

2. Description of the Related Art

A redistribution layer (RDL) interposer may include a bonding pad (under bump metallurgy) for bonding with a solder bump. In some example embodiments during reliability tests such as a temperature cycle (TC), a separation problem may occur due to a decrease in interface adhesion strength between the bonding pad bonded to the solder bump and an insulating layer.

SUMMARY

Example embodiments provide a semiconductor package including an interposer having a bonding pad structure capable of improving reliability.

Example embodiments provide a method of manufacturing the semiconductor package.

According to example embodiments, a semiconductor package includes an interposer having a first surface and a second surface opposite to the first surface and including a plurality of bonding pads, and first and second semiconductor devices on the interposer. Each of the plurality of bonding pads includes a first pad pattern provided to be exposed from the first surface and having a first width and a second pad pattern provided on the first pad pattern and having a second width greater than the first width.

According to example embodiments, a semiconductor package includes an interposer including a redistribution wiring layer having a first surface and a second surface opposite to the first surface and having redistribution wirings formed therein, and a plurality of bonding pads, each of the plurality of bonding pads includes a first pad pattern provided to be exposed from the first surface and having a first width and a second pad pattern on the first pad pattern and having a second width greater than the first width, first and second semiconductor devices on the second surface of the interposer, and a plurality of conductive connection members on respective first pad patterns.

According to example embodiments, a semiconductor package includes a package substrate, an interposer on the package substrate, having a first surface and a second surface opposite to the first surface, and including a plurality of first bonding pads and a plurality of second bonding pads, each first bonding pad of the plurality of first bonding pads includes a first pad pattern provided to be exposed from the first surface and having a first width and a second pad pattern provided on the first pad pattern and having a second width greater than the first width, the plurality of second bonding pads being exposed to the second surface, first and second semiconductor devices spaced apart from each other on the second surface of the interposer, a plurality of first conductive connection members on respective first pad patterns, and a plurality of second conductive connection members on respective second bonding pads. A width of the second bonding pad is smaller than the first width of the first pad pattern.

According to example embodiments, a semiconductor package includes an interposer and first and second semiconductor devices arranged on the interposer. The interposer includes a plurality of bonding pads provided to be exposed from a lower surface. The bonding pad includes a first pad pattern having a first width and a second pad pattern provided on the first pad pattern and having a second width greater than the first width. The bonding pad may be positioned fixedly within an insulating layer of the interposer. Thus, the bonding pad has a T-shaped cross-sectional shape, thereby causing an anchor effect. This anchor effect causes mechanical coupling to limit and/or prevent the bonding pad from being separated from the insulating layer during a semiconductor reliability test, such as a temperature cycle TC.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIG. 2 is an enlarged cross-sectional view illustrating portion 'A' in FIG. 1.

FIG. 3 is an enlarged cross-sectional view illustrating portion 'B' in FIG. 2.

FIGS. 4 to 20 are cross-sectional views illustrating a method of manufacturing a semiconductor package in accordance with example embodiments.

FIG. 21 is a cross-sectional view illustrating a semiconductor package in accordance with example embodiments.

FIG. 22 is an enlarged cross-sectional view illustrating portion 'C' in FIG. 21.

FIG. 23 is an enlarged cross-sectional view illustrating portion 'D' in FIG. 22.

FIGS. 24 to 29 are cross-sectional views illustrating a method of manufacturing a semiconductor package in accordance with example embodiments.

FIG. 30 is a cross-sectional view illustrating a semiconductor package in accordance with example embodiments.

FIG. 31 is an enlarged cross-sectional view illustrating portion 'E' in FIG. 30.

DETAILED DESCRIPTION OF EXAMPLE EMBODIMENTS

Hereinafter, example embodiments will be explained in detail with reference to the accompanying drawings.

Figure 1:
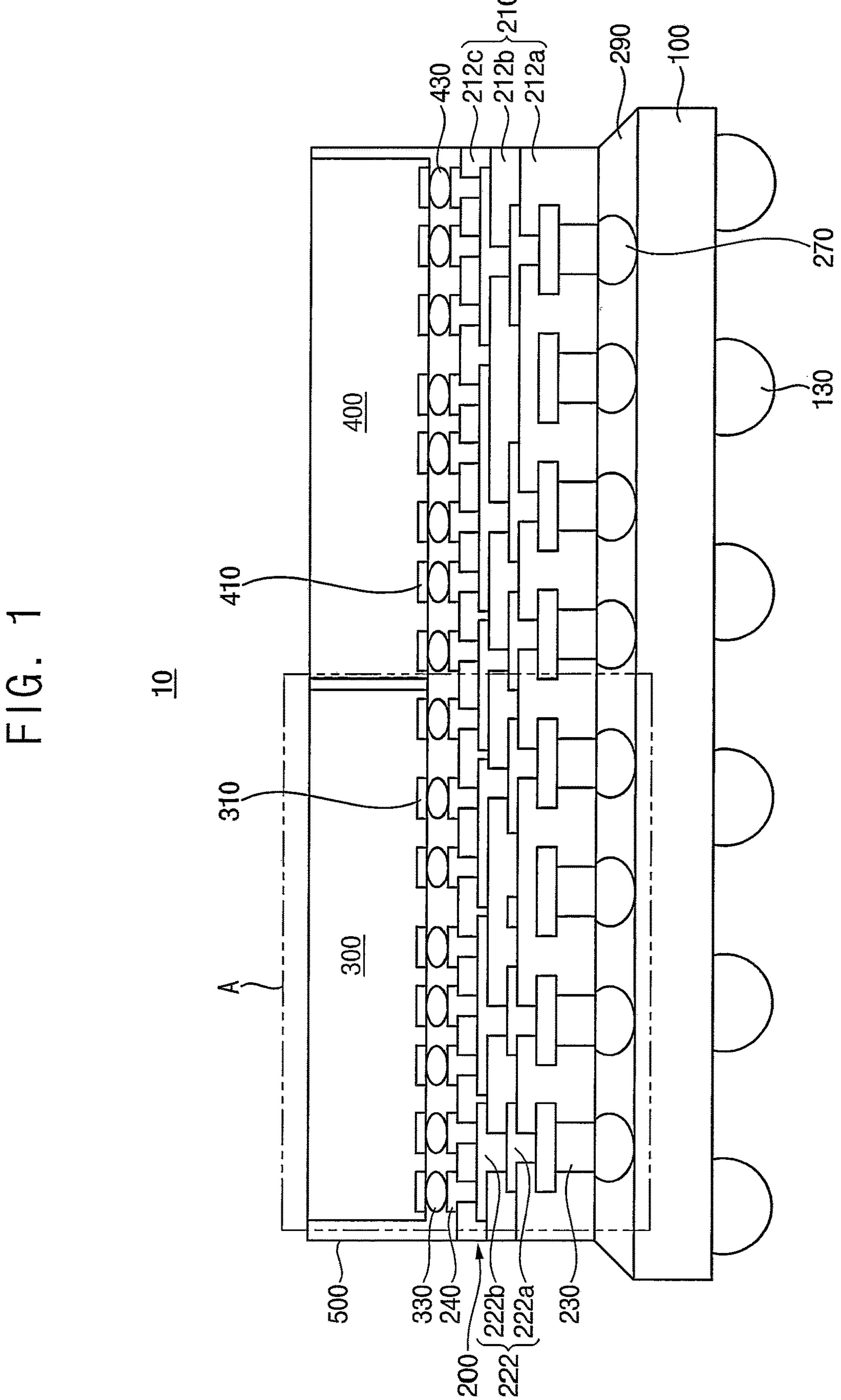
FIGS. 1 to 31 represent non-limiting, example embodiments as described herein.
Figure 2:
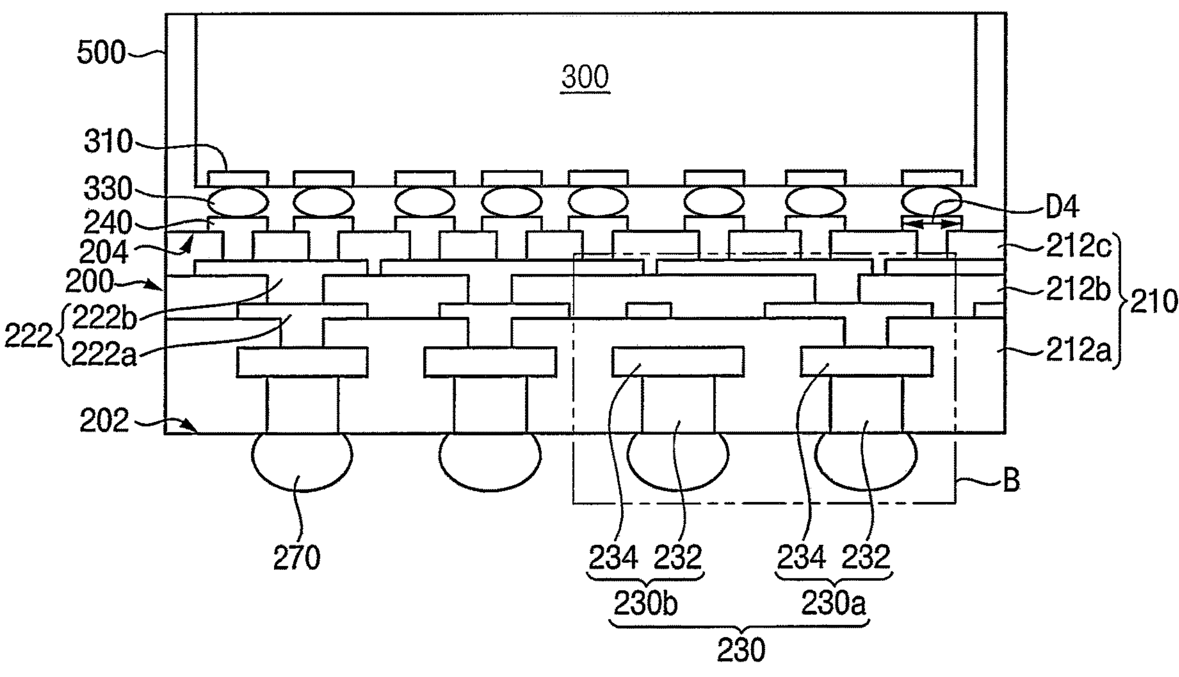
Figure 3:
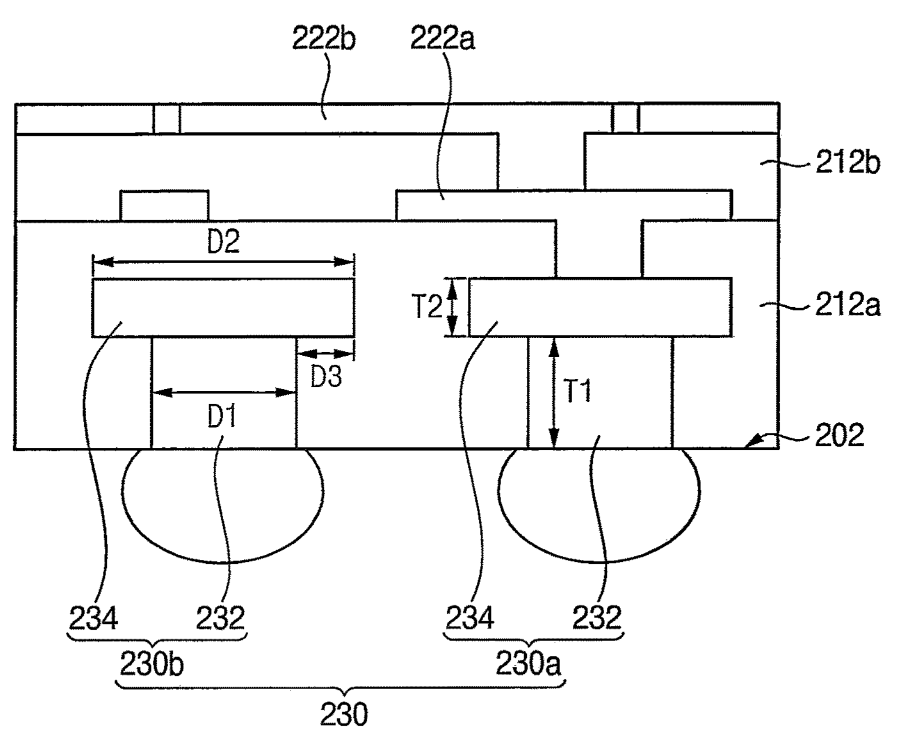

FIG. 1 is a cross-sectional view illustrating a semiconductor package in accordance with example embodiments. FIG. 2 is an enlarged cross-sectional view illustrating portion 'A' in FIG. 1. FIG. 3 is an enlarged cross-sectional view illustrating portion 'B' in FIG. 2.

Referring to FIGS. 1 to 3, a semiconductor package 10 may include an interposer 200, and a first semiconductor device 300 and a second semiconductor device 400 arranged on the interposer 200. Additionally, the semiconductor package 10 may further include a package substrate 100 on which the interposer 200 may be disposed.

In example embodiments, the semiconductor package 10 may be a memory device having a stacked chip structure in which a plurality of dies (e.g., chips) is stacked. For example, the semiconductor package 10 may include a semiconductor memory device with a 2.5D chip structure. In some example embodiments, the first semiconductor device 300 may include a logic semiconductor device, and the second semiconductor device 400 may include a memory device. The logic semiconductor device may be an ASIC as a host such as CPU, GPU and SoC. The memory device may include a high bandwidth memory (HBM) device.

In example embodiments, the package substrate 100 may have an upper surface and a lower surface facing each other. For example, the package substrate 100 may be a printed circuit board (PCB). The printed circuit board may be a multilayer circuit board having vias and various circuits therein.

The interposer 200 may be disposed (e.g., stacked) on the package substrate 100. A planar area of the interposer 200 may be smaller than a planar area of the package substrate 100. In plan view, the interposer 200 may be disposed (e.g., stacked) within the area of the package substrate 100.

The interposer 200 may be a redistribution wiring interposer having a plurality of redistribution wirings 222 formed therein. The first semiconductor device 300 and the second semiconductor device 400 may be connected to each other by the redistribution wirings in the interposer 200 and may be electrically connected to the package substrate 100 by solder bumps 270. The redistribution wiring interposer may provide high density interconnection between the first and the second semiconductor devices 300, 400. For example, the interposer 200 may have an area of about 20 mm by about 30 mm or more.

In example embodiments, the interposer 200 may include a redistribution wiring layer 210 having a plurality of the redistribution wirings 222. The interposer 200 may include a plurality of first bonding pads 230 provided to be exposed from a lower surface, that is, a first surface 202 of the redistribution wiring layer 210 and a plurality of second bonding pads 240 provided to be exposed from an upper surface, that is, a second surface 204 of the redistribution wiring layer 210.

In example embodiments, the redistribution wiring layer 210 may include a plurality of insulating layers 212*a*, 212*b*, 212*c* and the redistribution wirings 222 provided in the insulating layers. The redistribution wirings 222 may include first redistribution wirings 222*a* and second redistribution wirings 222*b*. The insulating layer may include a polymer, a dielectric layer, etc. The insulating layer may be formed by a vapor deposition process, a spin coating process, etc. The redistribution wiring may include aluminum (Al), copper (Cu), tin (Sn), nickel (Ni), gold (Au), platinum (Pt) or an alloy thereof. The redistribution wiring may be formed by a plating process, an electroless plating process, a vapor deposition process, etc.

In particular, a plurality of the first bonding pads 230 may be provided in the first insulating layer 212*a*. A lower surface of the first bonding pad 230 may be provided to be exposed from a lower surface of the first insulating layer 212*a*, that is, the first surface 202. The first insulating layer 212*a* may have a first opening that exposes an upper surface of the first bonding pad 230.

The first redistribution wiring 222*a* may be formed on the first insulating layer 212*a* and may contact the first bonding pad 230 through the first opening. The second insulating layer 212*b* may be formed on the first insulating layer 212*a* and may have a second opening that exposes the first redistribution wiring 222*a*.

The second redistribution wiring 222*b* may be formed on the second insulating layer 212*b* and may contact the first redistribution wiring 222*a* through the second opening. The third insulating layer 212*c* may be formed on the second insulating layer 212*b* and may have a third opening that exposes the second redistribution wiring 222*b*.

The second bonding pad 240 may be formed on the third insulating layer 212*c* and may contact the second redistribution wiring 222*b* through the third opening. Accordingly, a plurality of the second bonding pads 240 may be provided to be exposed from an upper surface of the third insulating layer 212*c*, that is, the second surface 204.

In example embodiments, the first bonding pad 230 may include a first pad pattern 232 as a first pad portion and a second pad pattern 234 as a second pad portion. The first pad pattern 232 may have a first width D1, and the second pad pattern 234 may have a second width D2 greater than the first width D1.

The first bonding pad 230 may be provided in the first insulating layer 212*a* of the redistribution wiring layer 210. The first pad pattern 232 may be provided to be exposed from the first surface 202 of the interposer 200. The second pad pattern 234 may be provided on the first pad pattern 232 in the first insulating layer 212*a* of the redistribution wiring layer 210. The second pad pattern 234 may be electrically connected to the first pad pattern 232. The second pad pattern 234 may directly contact the first pad pattern 232.

For example, the first width D1 of the first pad pattern 232 may be within a range of about 10 μm to about 800 μm, and the second width D2 of the second pad pattern 234 may be within a range of about 10 μm to about 800 μm. A difference D3 between the second width D2 of the second pad pattern 234 and the first width D1 of the first pad pattern 232 may be within a range of about 0.1 μm to about 2 μm.

The second pad pattern 234 protruding in a horizontal direction by the difference D3 between the first width D1 and the second width D2 may be provided in the first insulating layer 212*a* to cause an anchor effect to thereby firmly secure the first bonding pad by mechanical coupling.

A width D4 of the second bonding pad 240 may be smaller than a width of the first bonding pad 230 (e.g., the first width D1 of the first pad pattern 232).

For example, the width D4 of the second bonding pad 240 may be within a range of about 0.01 μm to about 10 μm.

The first pad pattern 232 may have a first thickness T1 and the second pad pattern 234 may have a second thickness T2 smaller than the first thickness T1. For example, the first thickness T1 of the first pad pattern 232 may be within a range of about 1 μm to about 10 μm, and the second thickness T2 of the second pad pattern 234 may be within a range of about 1 μm to about 10 μm. A ratio T1/T2 of the first thickness T1 and the second thickness T2 may be within a range of 1 to 5.

The first pad pattern 232 may include a first metal material, and the second pad pattern 234 may include a second metal material different from the first metal material. For example, the first metal material may include a conductive material such as copper (Cu), aluminum (Al), titanium (Ti) and/or an alloy thereof. The second metal material may include a conductive material such as nickel (Ni), molybdenum (Mo), titanium (Ti), gold (Au), silver (Ag), chromium (Cr), tin (Sn) and/or an alloy thereof.

In example embodiments, a plurality of the first bonding pads 230 may include a first connection pad 230*a* and a first dummy pad 230*b*. The first connection pad 230*a* may be electrically connected to the redistribution wiring 222. The first dummy pad 230*b* may not be electrically connected to the redistribution wiring 222.

As illustrated in FIG. 2, the first connection pad 230*a* of the second pad pattern 234 may be electrically connected to the first redistribution wiring 222*a*, while the first dummy pad 230*b* of the second pad pattern 234 may not be electrically connected to the first redistribution wiring 222*a*.

In example embodiments, the interposer 200 may be mounted on the package substrate 100 through solder bumps 270 as conductive connection members. The solder bump 270 may be formed on the first pad pattern 232 of the first bonding pad 230. For example, the solder bump 270 may include a C4 bump. The first bonding pad 230 of the interposer 200 may be electrically connected to a substrate pad of the package substrate 100 by the solder bump 270.

In an implementation, the first semiconductor device 300 may be arranged on the interposer 200. The first semiconductor device 300 may be mounted on the interposer 200 by a flip chip bonding manner. In some example embodiments, the first semiconductor device 300 may be mounted on the interposer 200 such that an active surface on which chip pads 310 are formed faces the interposer 200. The chip pads 310 of the first semiconductor device 300 may be electrically connected to the second bonding pads 240 of the interposer 200 by conductive bumps 330 as conductive connection members. For example, the conductive bumps 330 may include micro bumps (uBump).

The second semiconductor device 400 may be arranged on the interposer 200 to be spaced apart (e.g., isolated from direct contact with) from the first semiconductor device 300. The second semiconductor device 400 may be mounted on the interposer 200 by a flip chip bonding manner. In some example embodiments, the second semiconductor device 400 may be mounted on the interposer 200 such that an active surface on which chip pads 410 are formed faces the interposer 200. The chip pads 410 of the second semiconductor device 400 may be electrically connected to the second bonding pads 240 of the interposer 200 by conductive bumps 430. For example, the conductive bumps 430 may include micro bumps (uBump).

The first and second semiconductor devices 300, 400 may be arranged on the interposer 200 to be spaced apart (e.g., isolated from direct contact with) from each other. A sealing member 500 may be provided on the interposer 200 such that the sealing member 500 covers the first and second semiconductor devices 300, 400. Upper surfaces of the first and second semiconductor devices 300, 400 may be provided to be exposed by the sealing member 500. The sealing member may include an epoxy mold compound (EMC).

Although one first semiconductor device 300 and one second semiconductor device 400 are illustrated in the figures, it may not be limited thereto. For example, the second semiconductor device 400 may include a buffer die and a plurality of memory dies (chips) sequentially stacked on the buffer die.

In addition, the semiconductor package 10 may further include a first adhesive 290 that are underfilled between the interposer 200 and the package substrate 100. For example, the first adhesive may include an epoxy material to reinforce a gap between the interposer 200 and the package substrate 100.

Outer connection pads may be formed on the lower surface of the package substrate 100, and external connection members 130 for electrical connection with an external device may be disposed (e.g., stacked) on the outer connection pads. For example, the external connection member 130 may include a solder ball. The semiconductor package 10 may be mounted on a module substrate (not illustrated) through the solder balls to form a memory module.

Although only some substrates, some bonding pads, and some wirings are illustrated in the drawings, it may be understood that the number and arrangement of the substrates, the bonding pads, and the wirings are exemplary, and it may be not limited thereto. Since the wirings as well as the substrates are well known in the art to which the present inventive concepts pertains, illustration and description concerning the above elements will be omitted.

As mentioned above, the semiconductor package 10 may include the interposer 200 having the first surface 202 and the second surface 204 and the first and second semiconductor devices 300, 400 arranged on the second surface 204 of the interposer 200. The interposer 200 may include the first pad pattern 232 provided to be exposed from the first surface 202 and having the first width D1 and the second pad pattern 234 positioned on the first pad pattern 232 and having the second width D2 greater than the first width D1. The first bonding pad 230 may be positioned fixedly within the insulating layer 212*a* of the interposer 200.

Accordingly, the first bonding pad 230 has the T-shaped cross-sectional shape, thereby causing an anchor effect. This anchor effect may cause mechanical coupling to limit and/or prevent the first bonding pad 230 from being separated from the insulating layer 212*a* during a semiconductor reliability test such as a temperature cycle TC.

Hereinafter, a method of manufacturing the semiconductor package in FIG. 1 will be explained.

FIGS. 4 to 20 are cross-sectional views illustrating a method of manufacturing a semiconductor package in accordance with example embodiments.

Referring to FIGS. 4 to 8, a plurality of first bonding pads 230 each including a first pad pattern 232 and a second pad pattern 234 may be formed.

Figure 4:
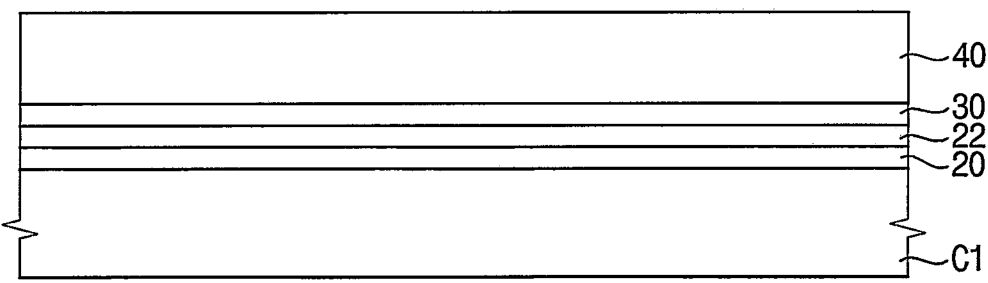

As illustrated in FIG. 4, a release tape 20, a barrier metal layer 22, a seed layer 30 and a photoresist layer 40 may be sequentially formed on a carrier substrate C1.

Figure 5:
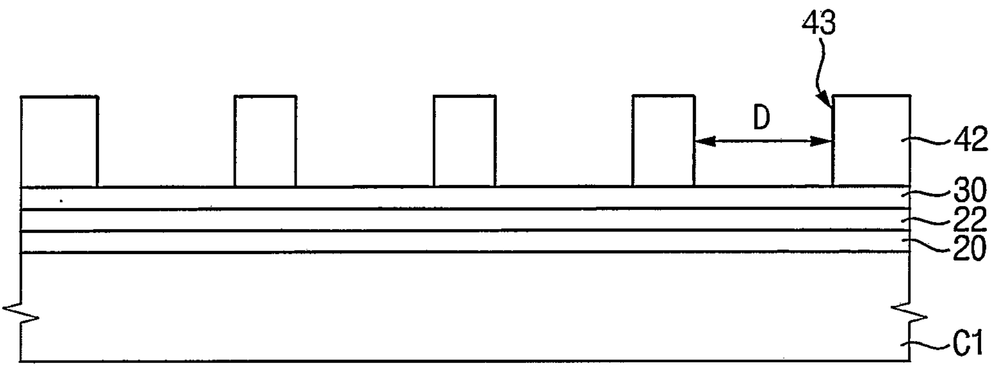

The seed layer 30 may include copper (Cu), aluminum (Al), titanium (Ti), and/or an alloy thereof. The seed layer 30 may be formed by a sputtering process. Then, as illustrated in FIG. 5, an exposure process may be performed on the photoresist layer 40 to form a photoresist pattern 42 having an opening 43 that exposes the first bonding pad region. For example, a diameter D of the opening 43 may be within a range of about 10 μm to about 800 μm.

Figure 6:
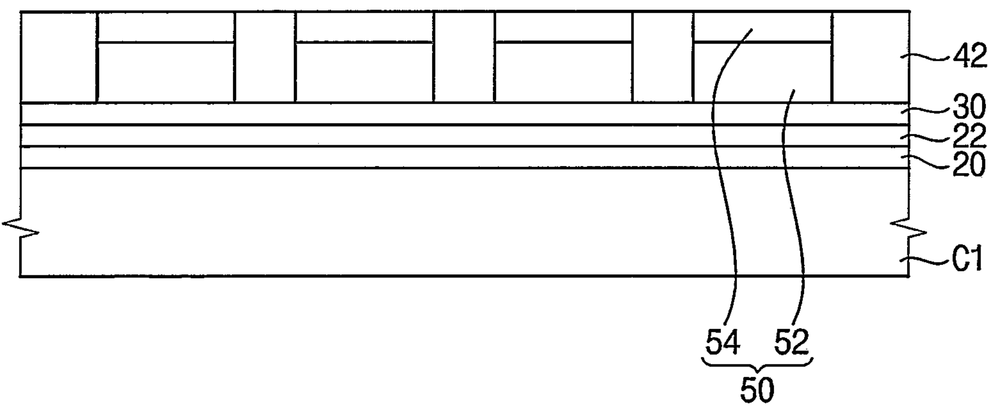

Then, as illustrated in FIG. 6, a first plating process may be performed on the seed layer 30 to form a first metal pattern 52 including a first metal material, and then a second plating process may be performed on the first metal pattern 52 to form a second metal pattern 54 including a second metal material different from the first metal material.

The first and second plating processes may include an electro plating process or an electroless plating process. For example, the first metal material may include copper (Cu), aluminum (Al), titanium (Ti), and/or an alloy thereof. The second metal material may include nickel (Ni), molybdenum (Mo), titanium (Ti), gold (Au), silver (Ag), chromium (Cr), tin (Sn) or an alloy thereof. The first metal material may include the same material (e.g., a same metal) as the seed layer 30. The second metal material may include a material having an etch selectivity with respect to the first metal material. In a subsequent etching process for partially removing the first metal pattern and the plating layer, an etch rate of the first metal material may be greater than an etch rate of the second metal material.

Figure 7:
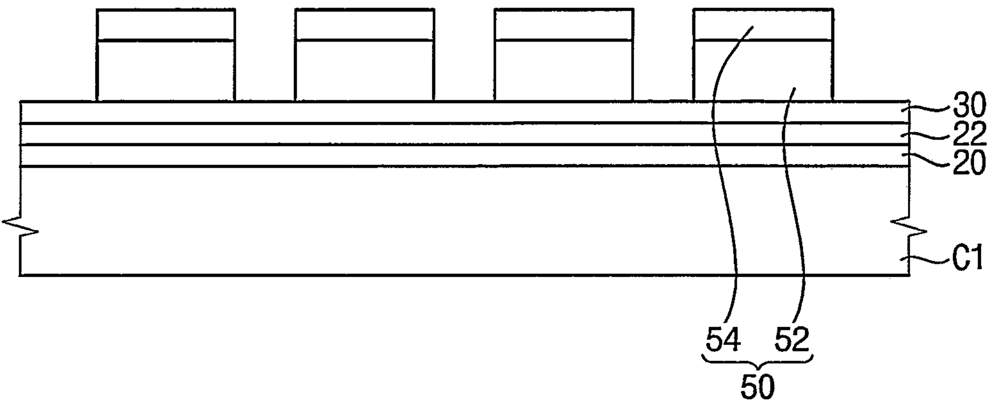

As illustrated in FIG. 7, the photoresist pattern 42 may be removed to form a preliminary bonding pad 50 including the first and second metal patterns 52, 54 on the seed layer 30.

Figure 8:
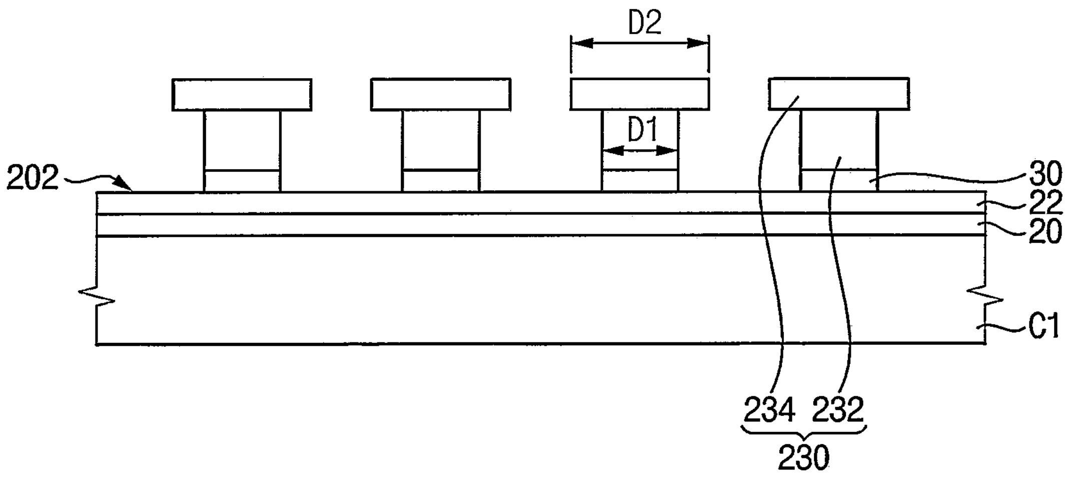

As illustrated in FIG. 8, a portion of the first metal pattern 52 may be removed to form the first pad pattern 232. The portion of the first metal pattern 52 may be removed by a wet etching process. In some example embodiments, portions of the seed layer 30 exposed by the first metal patterns 52 may be removed together.

The wet etching process may be performed using an etchant having an etch selectivity with respect to the second metal pattern 54. The etchant may include water ($H_2O$), hydrogen peroxide ($H_2O_2$), citric acid ($C_6H_8O_7$), etc. Accordingly, the second metal pattern 54 may be not removed by the wet etching process, but a portion of a sidewall of the first metal pattern 52 and the portions of the exposed seed layer 30 may be removed. Thus, a plurality of the first bonding pads 230 that include the first pad pattern 232 as a first pad portion having a first width D1 and the second pad pattern 234 as a second pad portion having a second width D2 greater than the first width D1 may be formed.

Because the second width D2 of the second pad pattern 234 is greater than the first width D1 of the first pad pattern 232, the first bonding pad 230 may have a T-shaped cross-sectional shape.

Referring to FIGS. 9 to 14, a redistribution wiring layer 210 having redistribution wirings 222 electrically connected to first connection pads 230*a* of the first bonding pads 230 may be formed.

Figure 9:
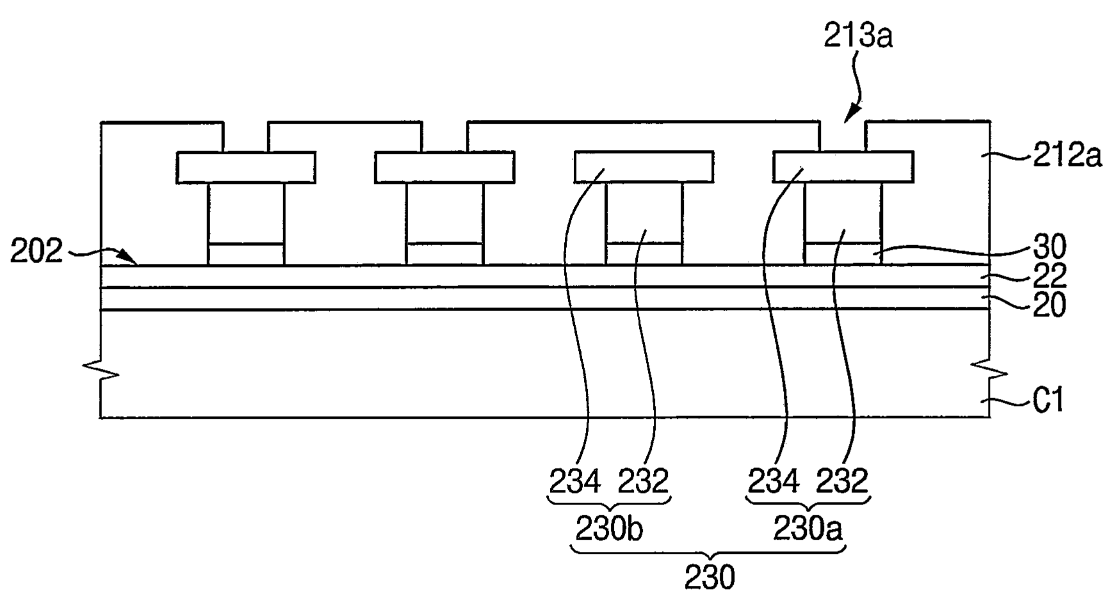

As illustrated in FIG. 9, after a first insulating layer 212*a* is formed on the barrier metal layer 22 to cover the first bonding pads 230, the first insulating layer 212*a* may be patterned to form first openings 213*a* that expose a portion 230*a* of the first bonding pads 230.

For example, the first insulating layer 212*a* may include a polymer, a dielectric layer, etc. In particular, the first insulating layer 212*a* may include polyimide (PI), lead oxide (PbO), polyhydroxystyrene (PHS), novolac (NOVOLAC), etc. The first insulating layer 212*a* may be formed by a vapor deposition process, a spin coating process, etc.

Since the surface of the first pad pattern 232 formed by the wet etching process has a larger surface roughness than before performing the wet etching process, a frictional force between the first pad pattern 232 and the first insulating layer 212*a* may be increased.

A plurality of first bonding pads 230 may include the first connection pad 230*a* and a first dummy pad 230*b*. Each of the first connection pad 230*a* and the first dummy pad 230*b* may include the first pad pattern 232 having the first width D1 and the second pad pattern 234 having the second width D2 greater than the first width D1. Only the second pad pattern 234 of the first connection pad 230*a* may be exposed through the first opening 213*a*, and the first dummy pad 230*b* may not be exposed through the first opening 213*a*. The first insulating layer 212*a* may fill a space between the first bonding pads 230.

Figure 10:
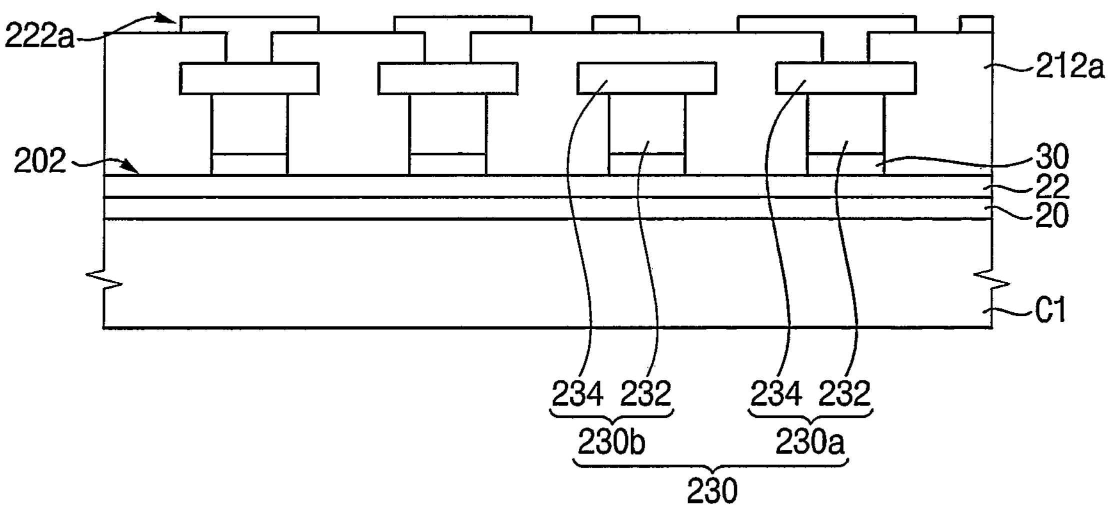

As illustrated in FIG. 10, a first redistribution wiring 222*a* may be formed on the first insulating layer 212*a* to directly contact the second pad pattern 234 of the first connection pad 230*a* through the first opening.

The first redistribution wiring 222*a* may be formed by forming a seed layer on a portion of the first insulating layer 212*a* and in the first opening, patterning the seed layer and performing an electroplating process. Accordingly, at least a portion of the first redistribution wiring 222*a* may directly contact the second pad pattern 234 of the first connection pad 230*a* through the first opening.

For example, the first redistribution wiring may include aluminum (Al), copper (Cu), tin (Sn), nickel (Ni), gold (Au), platinum (Pt) and/or an alloy thereof.

Figure 11:
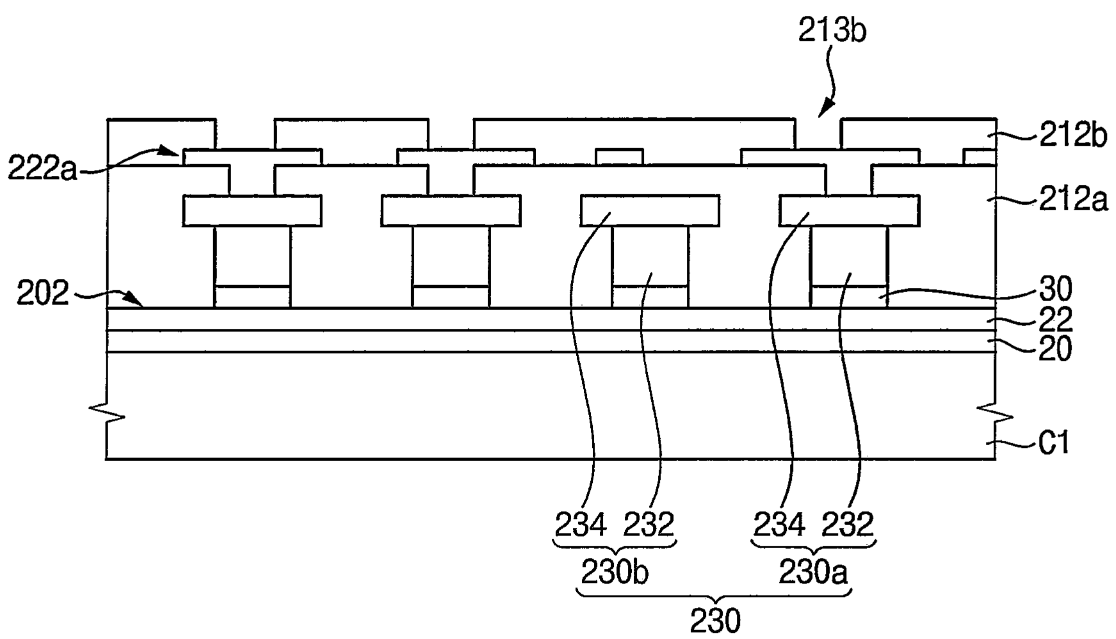

As illustrated in FIG. 11, after a second insulating layer 212*b* is formed on the first insulating layer 212*a* to cover the first redistribution wirings 222*a*, the second insulating layer 212*b* may be patterned to form a second opening 213*b* that exposes the first redistribution wiring 222*a*.

Figure 12:
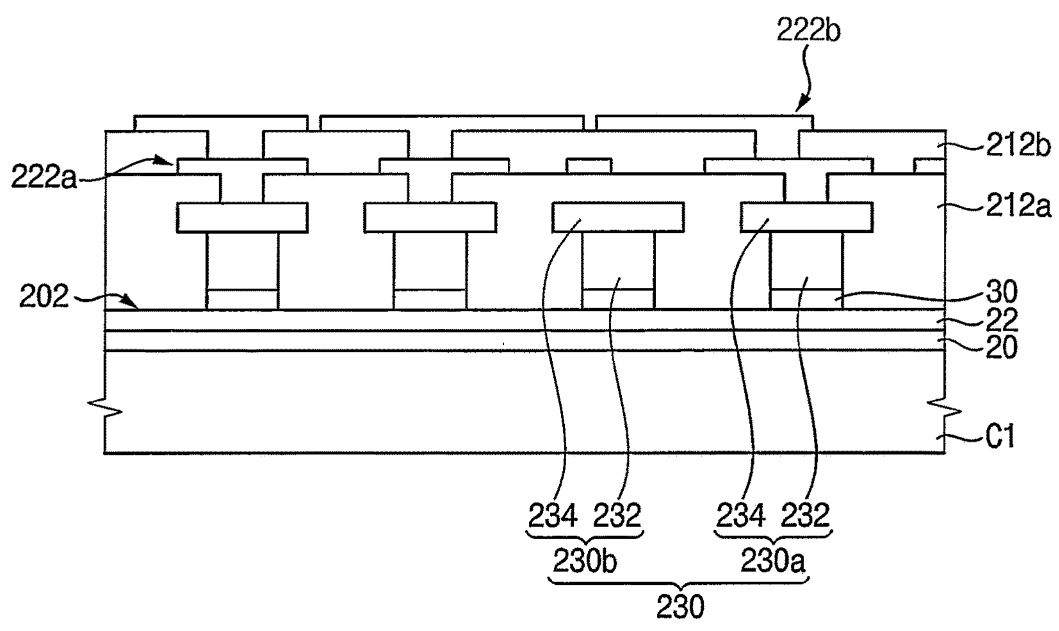

As illustrated in FIG. 12, a second redistribution wiring 222*b* may be formed on the second insulating layer 212*b* to directly contact the first redistribution wiring 222*a* through the second opening.

Figure 13:
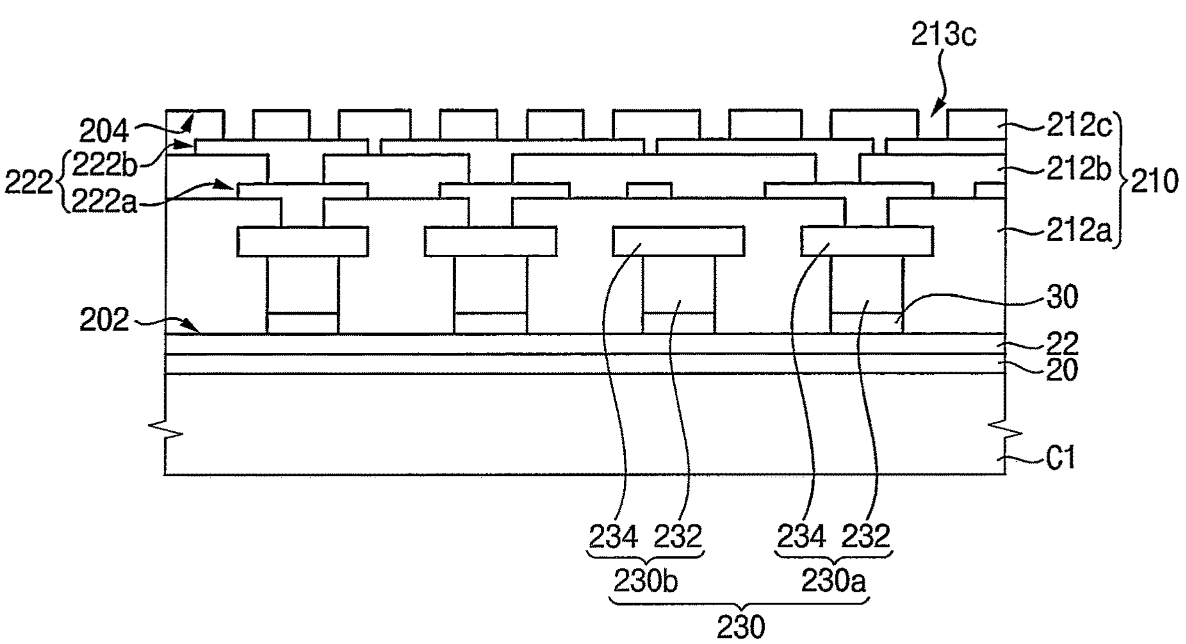

As illustrated in FIG. 13, after a third insulating layer 212*c* is formed on the second insulating layer 212*b* to cover the second redistribution wiring 222*b*, the third insulating layer 212*c* may be patterned to form a third opening 213*c* that expose the second redistribution wiring 222*b*.

Figure 14:
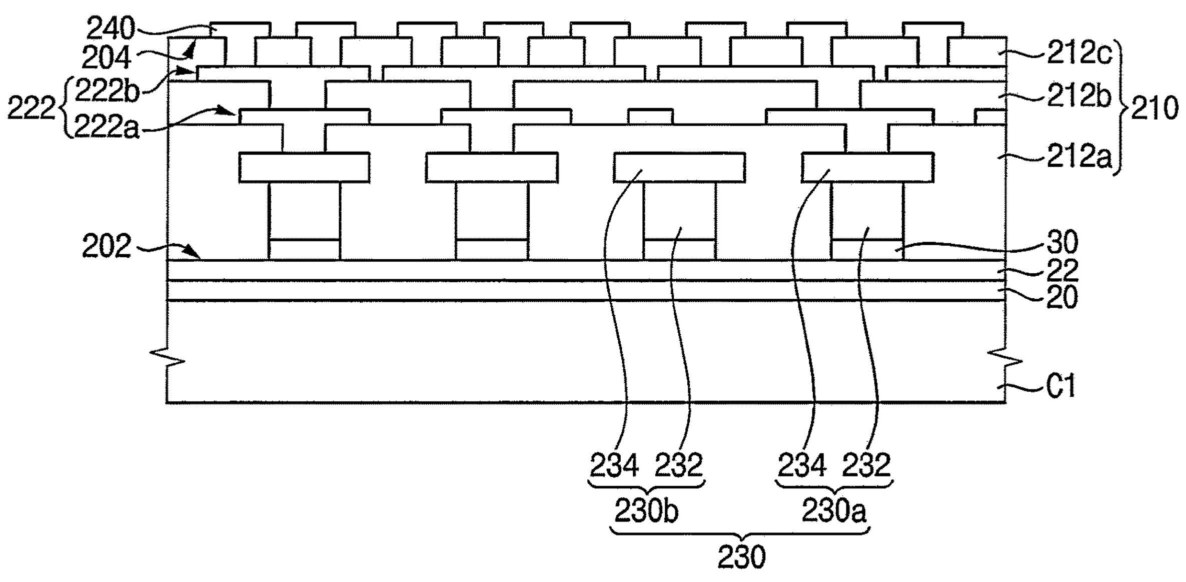

As illustrated in FIG. 14, a plurality of second bonding pads 240 may be formed on the third insulating layer 212*c* to directly contact the second redistribution wirings 222*b* through the third openings.

Thus, the redistribution wiring layer 210 including the redistribution wirings 222 may be formed. A plurality of the first bonding pads 230 may be formed on the lower surface 202, that is, the first surface of the redistribution wiring layer 210. A plurality of the second bonding pads 240 may be formed on the upper surface 204, that is, the second surface of the redistribution wiring layer 210.

The first connection pads 230*a* of the first bonding pads 230 may be electrically connected to the redistribution wirings 222. The first dummy pads 230*b* of the first bonding pads 230 may not be electrically connected to the redistribution wirings 222.

Figure 15:
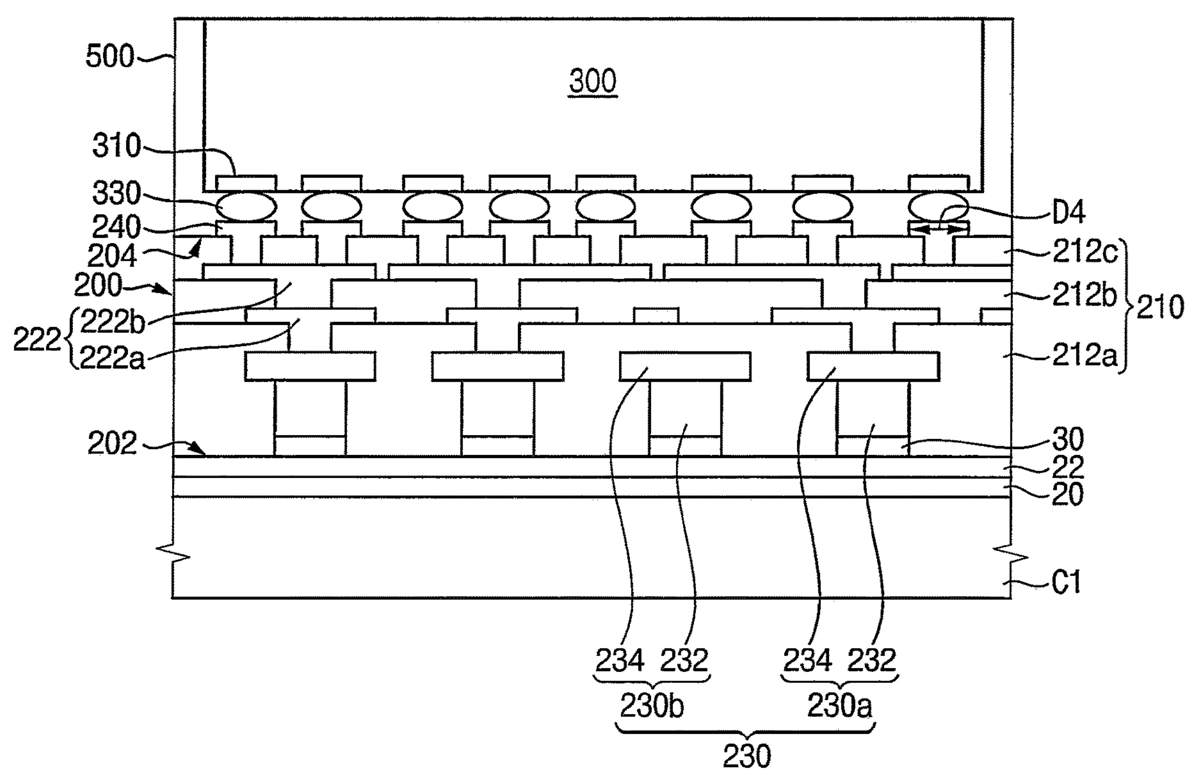

Referring to FIG. 15, after a first semiconductor device 300 and a second semiconductor device 400 (See FIG. 1) are mounted on the redistribution wiring layer 210, a sealing member 500 may be formed on the redistribution wiring layer 210 to cover the first semiconductor device 300 and the second semiconductor device. The first semiconductor device 300 and the second semiconductor device 400 may be arranged on the redistribution wiring layer 210 to be spaced apart (e.g., isolated from direct contact with) from each other.

In example embodiments, the first and second semiconductor devices may be mounted on the redistribution wiring layer 210 in a flip chip bonding manner. Chip pads 310 of the first semiconductor device 300 may be electrically connected to the second bonding pads 240 of the redistribution wiring layer 210 by conductive bumps 330. Chip pads 410 (See FIG. 1) of the second semiconductor device may be electrically connected to the second bonding pads 240 of the redistribution wiring layer 210 by conductive bumps 430 (See FIG. 1). For example, the conductive bumps 330, 430 may include a micro bump (uBump).

For example, the first semiconductor device 300 may include a logic semiconductor device, and the second semiconductor device may include a memory device. The logic semiconductor device may be an ASIC as a host such as a CPU, GPU, or SoC. The memory device may include a high bandwidth memory (HBM) device. In some example embodiments, the second semiconductor device may include a buffer die and a plurality of memory dies (chips) sequentially stacked on the buffer die. The buffer die and the memory dies may be electrically connected to each other by through silicon vias.

For example, the sealing member 500 may include an epoxy mold compound (EMC). The sealing member 500 may be formed to expose upper surfaces of the first and second semiconductor devices.

Referring to FIGS. 16 to 19, solder bumps 270 may be formed on the first bonding pads 230 of the redistribution wiring layer 210.

Figure 16:
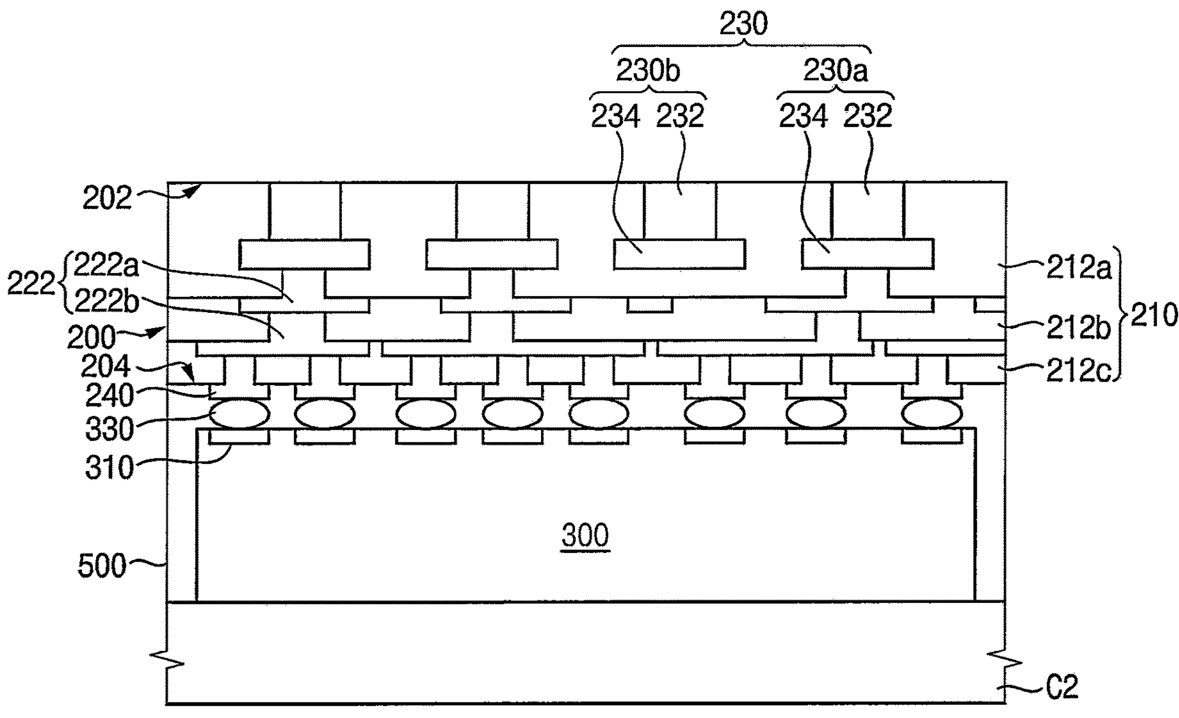

As illustrated in FIG. 16, after attaching a carrier substrate C2 on the sealing member 500, the structure to which the carrier substrate C2 is attached may be turned over, and the barrier metal layer 22 and the carrier substrate C1 may be removed. In some example embodiments, the seed layer 30 may be also removed so that the first bonding pads 230 may be exposed from the first surface 202 of the redistribution wiring layer 210.

Figure 17:
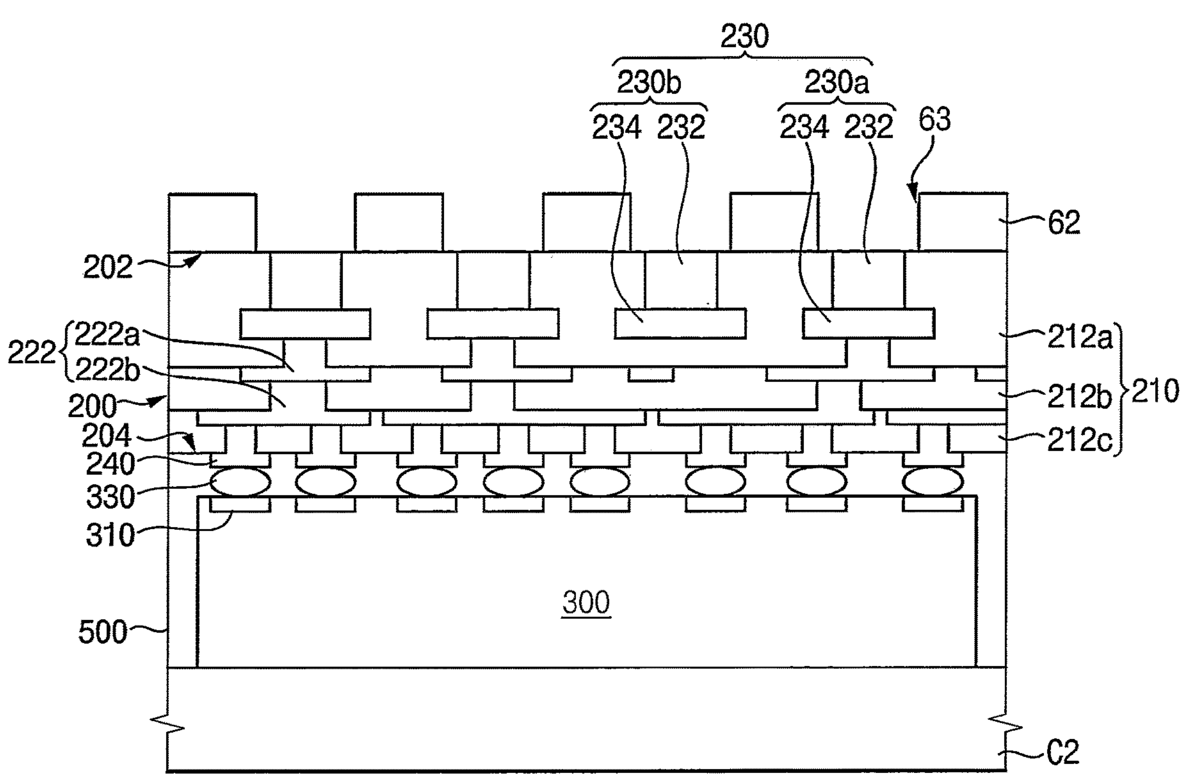
Figure 18:
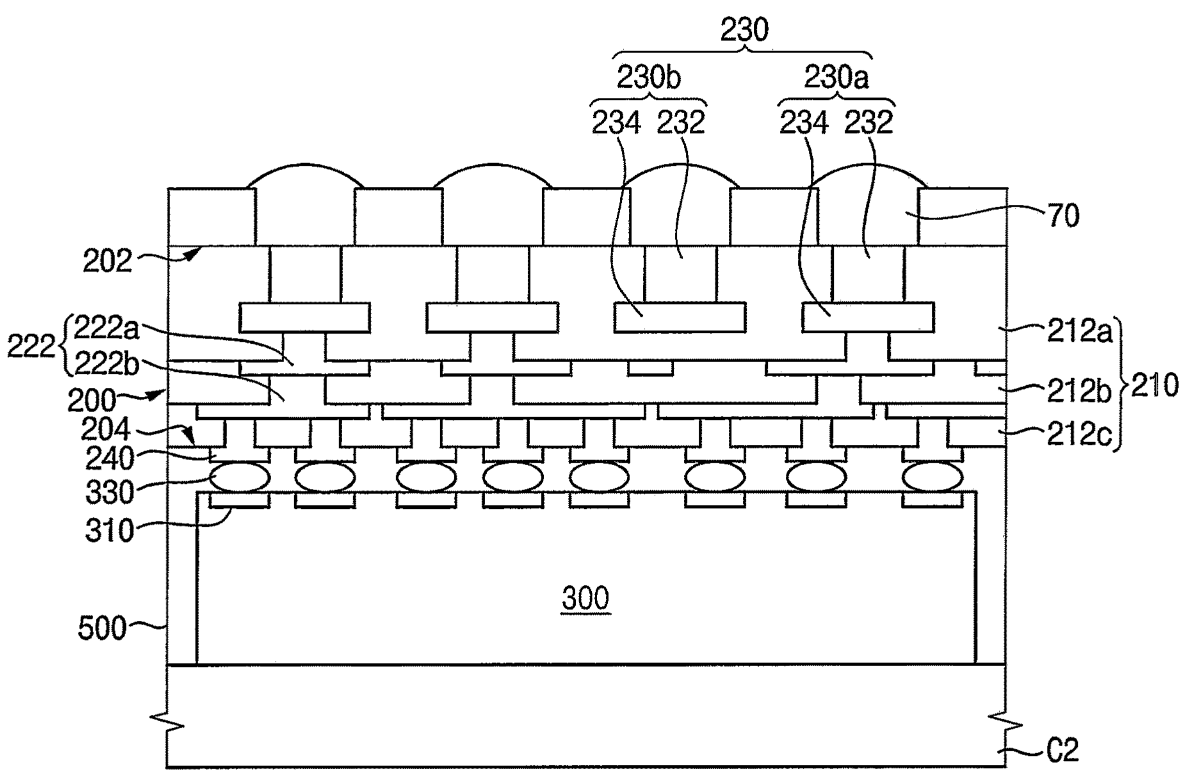
Figure 19:
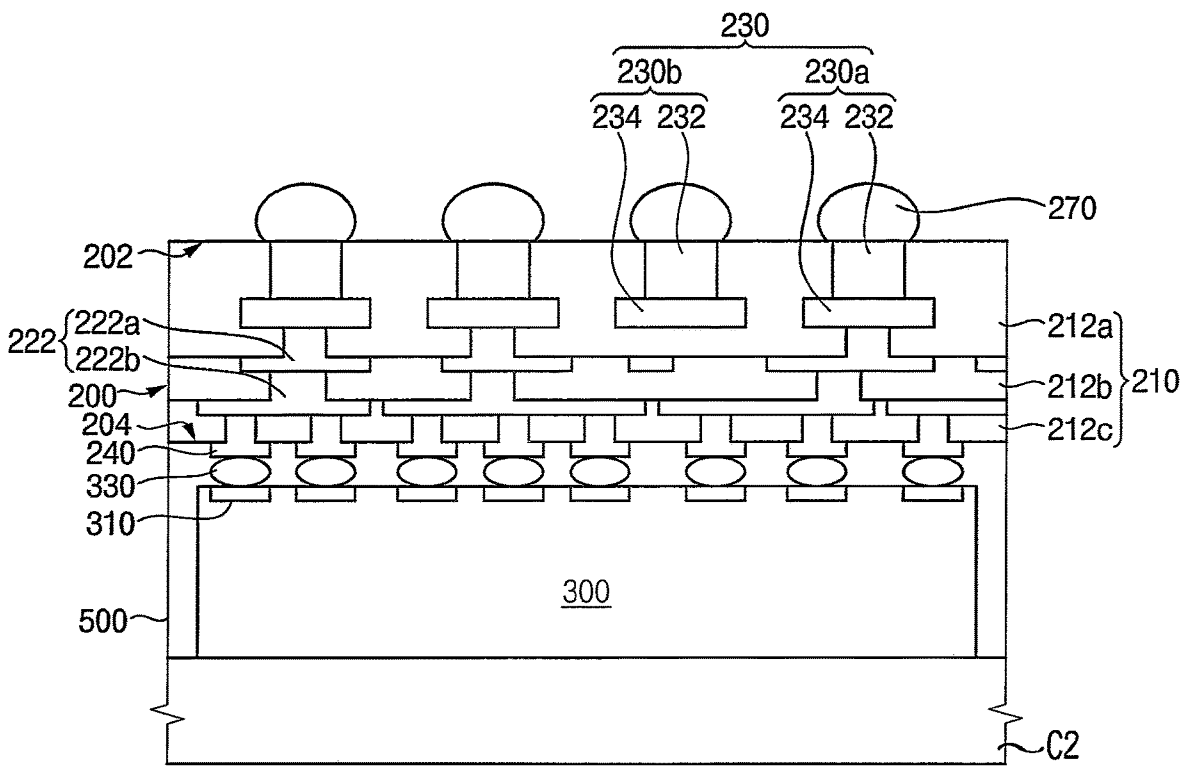

Referring to FIGS. 17 to 19, a photoresist pattern 62 having an opening 63 that exposes a region of the first bonding pad 230 may be formed on the first surface 202 of the redistribution wiring layer 210, and then, the solder bump 270 may be formed on the first bonding pad 230.

In particular, after filling the opening 63 of the photoresist pattern 62 with a conductive material 70, the photoresist pattern 62 may be removed and a reflow process may be performed to form the solder bump 270. For example, the conductive material 70 may be formed by a plating process. Alternatively, the solder bump 270 may be formed by a screen printing process, a vapor deposition process, etc. For example, the solder bump 270 may include a C4 bump.

Figure 20:
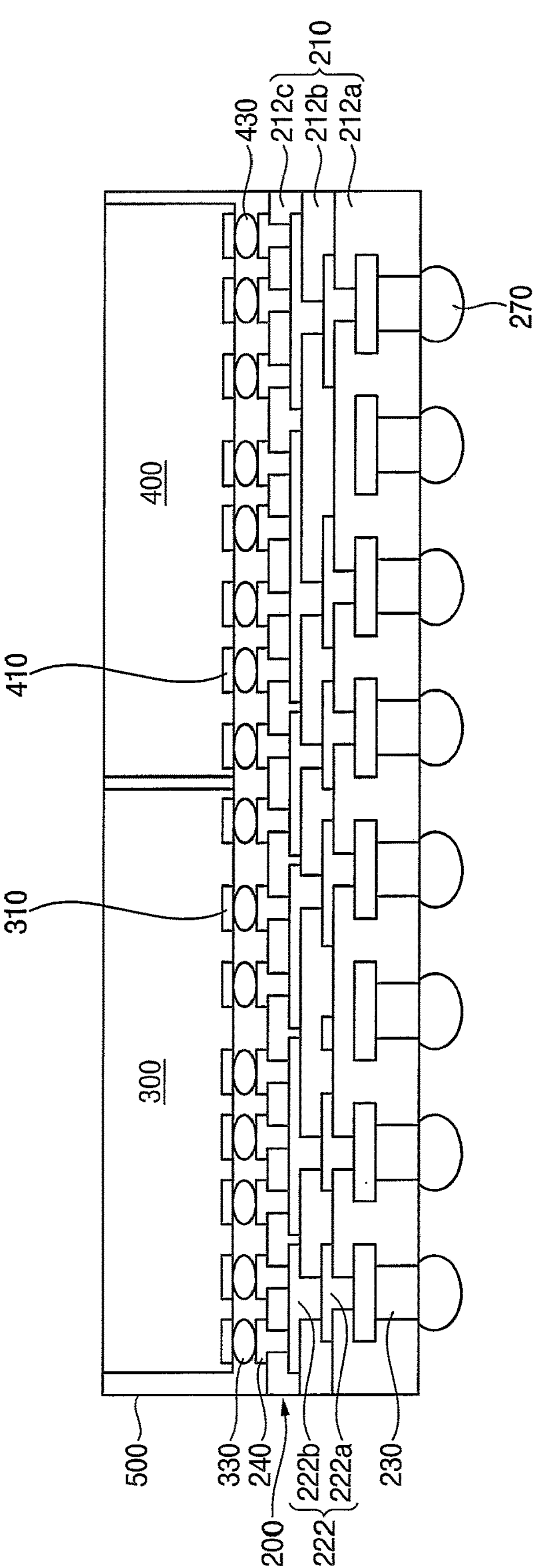

Referring to FIG. 20, the redistribution wiring layer 210 may be cut to form an interposer 200, and the interposer 200 may be disposed (e.g., stacked) on a package substrate 100 (See FIG. 1) to complete the semiconductor package 10 in FIG. 1.

In example embodiments, the interposer 200 may be mounted on the package substrate 100 via the solder bumps 270. The interposer 200 may be attached on the package substrate 100 by a thermal compression process.

Then, a first adhesive 290 may be underfilled between the interposer 200 and the package substrate 100. A planar area of the interposer 200 may be smaller than a planar area of the package substrate 100.

Then, external connection members such as solder balls may be disposed (e.g., stacked) on an outer connection pads 130 on a lower surface of the package substrate 100 to complete the semiconductor package 10 in FIG. 1.

Figure 21:
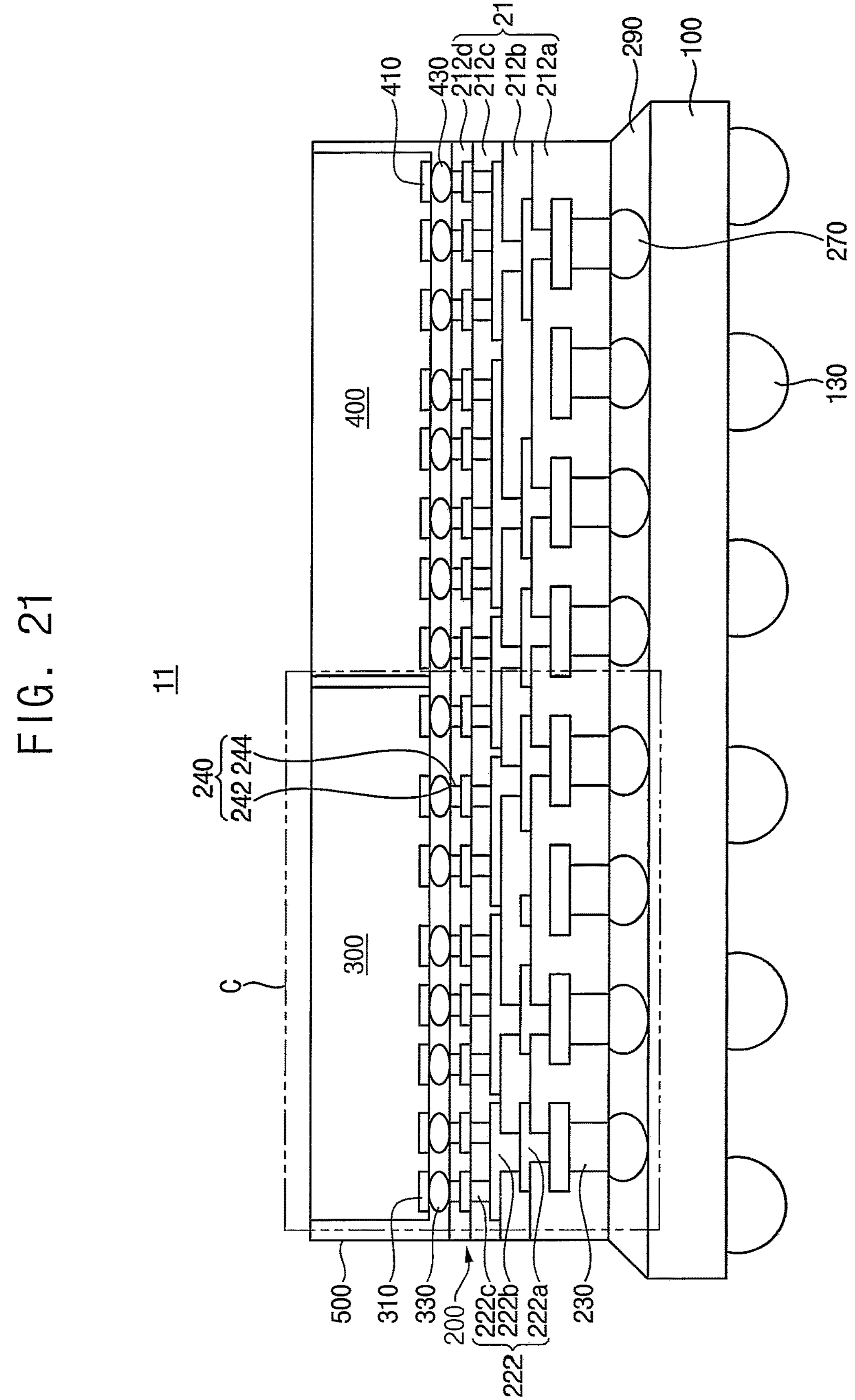
Figure 22:
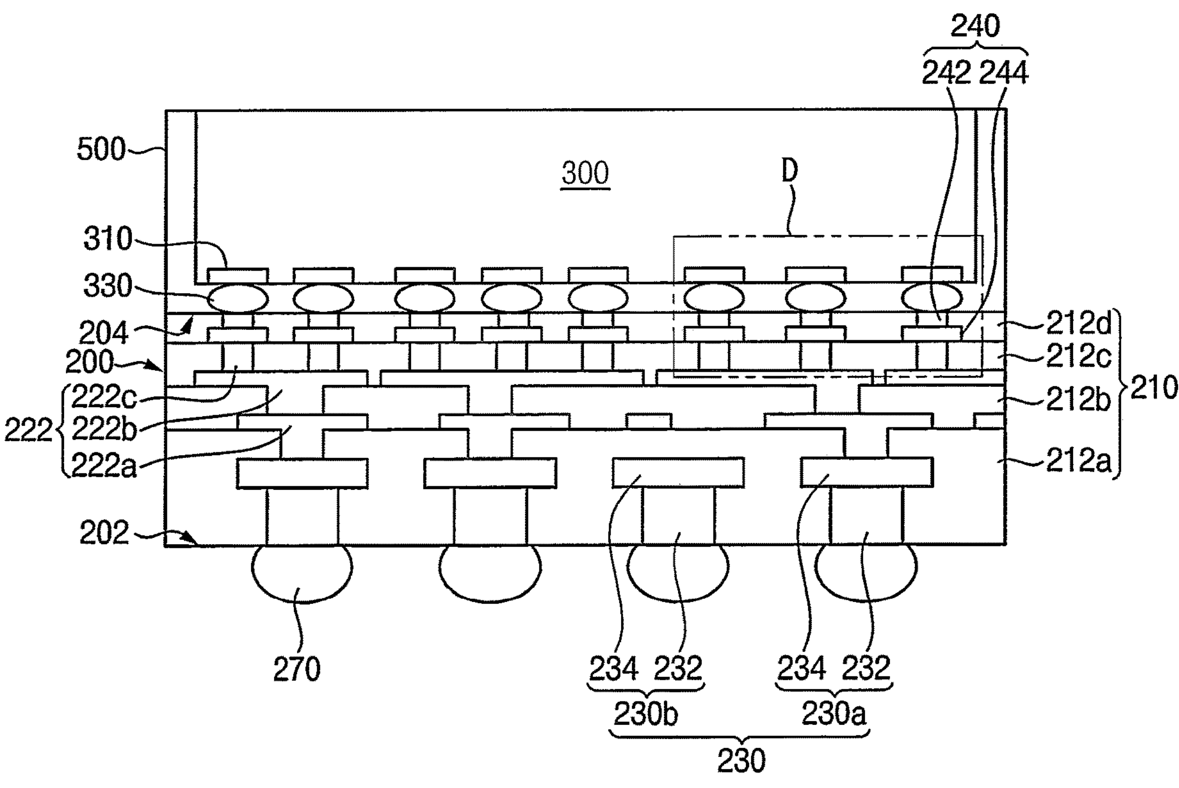
Figure 23:
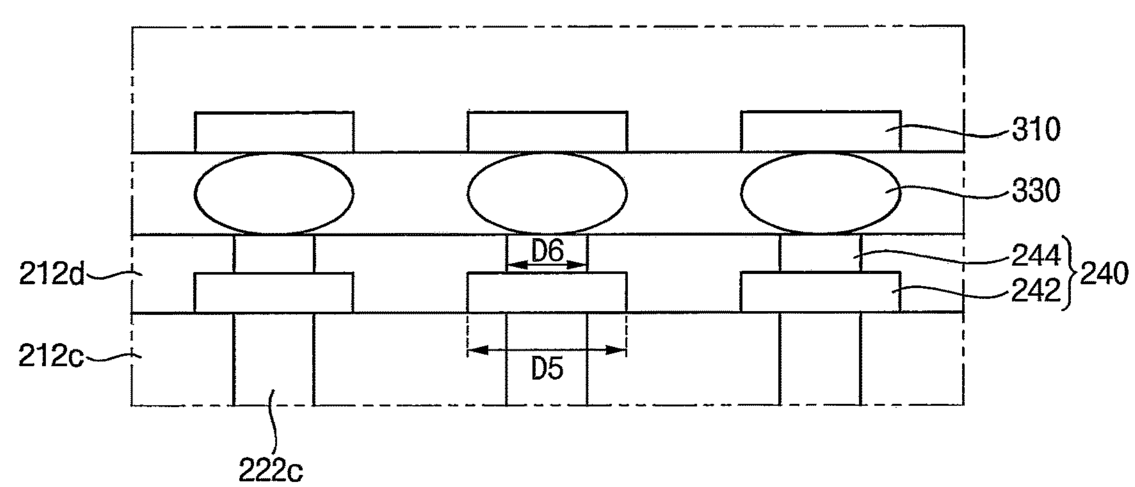

FIG. 21 is a cross-sectional view illustrating a semiconductor package in accordance with example embodiments. FIG. 22 is an enlarged cross-sectional view illustrating portion 'C' in FIG. 21. FIG. 23 is an enlarged cross-sectional view illustrating portion 'D' in FIG. 22. The semiconductor package may be substantially the same as or similar to the semiconductor package described with reference to FIGS. 1 to 3 except for a configuration of the second bonding pad. Thus, same or similar components are denoted by the same or similar reference numerals, and repeated descriptions of the same components will be omitted.

Referring to FIGS. 21 to 23, an interposer 200 of a semiconductor package 11 may include a plurality of second bonding pads 240 provided to be exposed from an upper surface, that is, a second surface 204 of the interposer 200. The interposer 200 may include a redistribution wiring layer 210 having a plurality of redistribution wirings 222.

In example embodiments, the redistribution wiring layer 210 may include a plurality of insulating layers 212*a*, 212*b*, 212*c*, and 212*d* and the redistribution wirings 222 provided in the insulating layers. The redistribution wirings 222 may include first redistribution wirings 222*a*, second redistribution wirings 222*b* and third redistribution wirings 222*c*.

In particular, the third insulating layer 212*c* may be formed on the second insulating layer 212*b* and may have a third opening that exposes the second redistribution wiring 222*b*. The third redistribution wiring 222*c* may be formed on the third insulating layer 212*c* and may contact the second redistribution wiring 222*b* through the third opening.

The fourth insulating layer 212*d* may be formed on the third insulating layer 212*c* and may have a fourth opening that exposes the third redistribution wiring 222*c*. The second bonding pad 240 may be formed in the fourth insulating layer 212*d* and may contact the third redistribution wiring 222*c* through the fourth opening. The upper surface of the second bonding pad 240 may be provided to be exposed from the upper surface of the fourth insulating layer 212*d*, that is, the second surface 204.

In example embodiments, the second bonding pad 240 may include a third pad pattern 242 as a third pad portion having a fourth width D6 and a fourth pad pattern 244 as a fourth pad portion having a fifth width D5 greater than the fourth width D6

For example, the fourth width D6 of the third pad pattern 242 may be within a range of about 0.01 μm to about 10 μm, and the fifth width D5 of the fourth pad pattern 244 may be within a range of about 0.01 μm to about 10 μm.

The fourth pad pattern 244 protruding in a horizontal direction by a difference between the fourth width D6 and the fifth width D5 may be provided in the fourth insulating layer 212*d* to cause an anchor effect to thereby secure the second bonding pad by mechanical coupling.

The third pad pattern 242 may have a third thickness, and the fourth pad pattern 244 may have a fourth thickness smaller than the third thickness. The third pad pattern 242 may include a third metal material, and the fourth pad pattern 244 may include a fourth metal material different from the third metal material. For example, the third metal material may include a conductive material such as copper (Cu), aluminum (Al), titanium (Ti) and/or an alloy thereof. The fourth metal material may include a conductive material such as nickel (Ni), molybdenum (Mo), titanium (Ti), gold (Au), silver (Ag), chromium (Cr), tin (Sn) and/or an alloy thereof.

In example embodiments, a first semiconductor device 300 may be arranged on the interposer 200. The first semiconductor device 300 may be mounted on the interposer 200 by a flip chip bonding manner. In some example embodiments, the first semiconductor device 300 may be mounted on the interposer 200 such that an active surface on which chip pads 310 are formed faces the interposer 200. The chip pads 310 of the first semiconductor device 300 may be electrically connected to the third pad patterns 242 of the second bonding pads 240 of the interposer 200 by the conductive bumps 330 as conductive connecting members, respectively. For example, the conductive bumps 330 may include micro bumps (uBump).

A second semiconductor device 400 may be arranged on the interposer 200 to be spaced apart (e.g., isolated from direct contact with) from the first semiconductor device 300. The second semiconductor device 400 may be mounted on the interposer 200 by a flip chip bonding manner. In some example embodiments, the second semiconductor device 400 may be mounted on the interposer 200 such that an active surface on which chip pads 410 are formed faces the interposer 200. The chip pads 410 of the second semiconductor device 400 may be electrically connected to the third pad patterns 242 of the second bonding pads 240 of the interposer 200 by conductive bumps 430, respectively. For example, the conductive bumps 430 may include micro bumps (uBump).

Hereinafter, a method of manufacturing the semiconductor package in FIG. 21 will be explained.

FIGS. 24 to 29 are cross-sectional views illustrating a method of manufacturing a semiconductor package in accordance with example embodiments.

Figure 24:
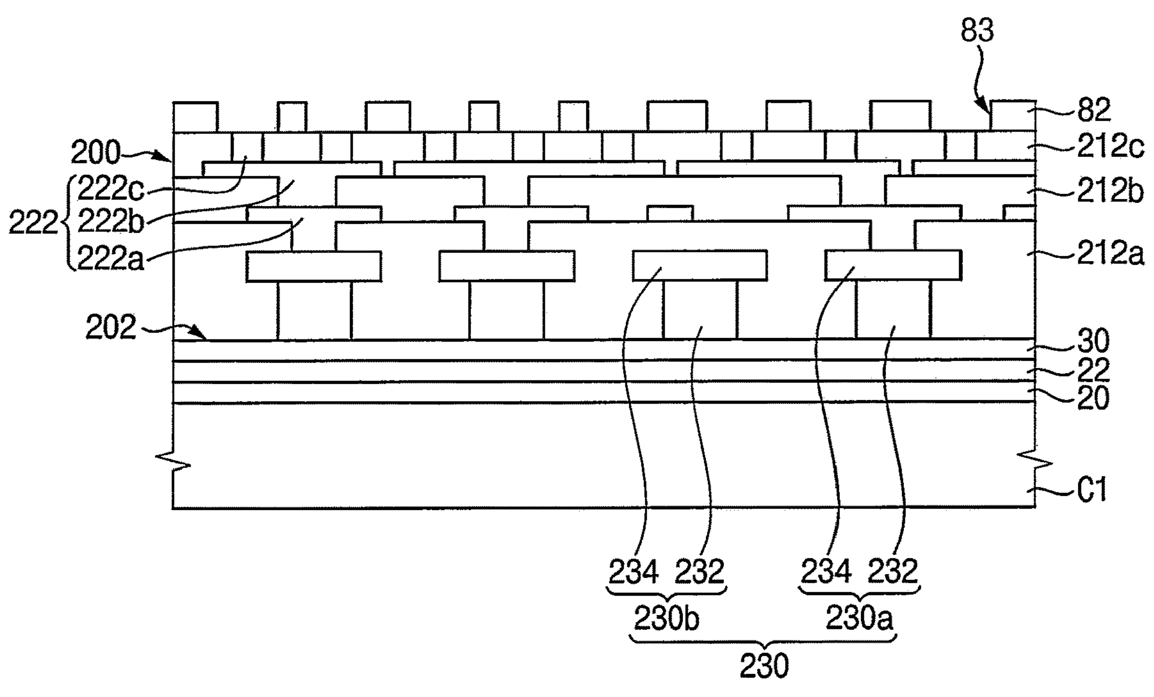

Referring to FIG. 24, processes the same as or similar to the processes described with reference to FIGS. 4 to 14 may be performed to form first to the third insulating layers 212*a*, 212*b*, 212*c* having first to third redistribution wirings 222*a*, 222*b*, 222*c*, and then, a photoresist pattern 82 having an opening 83 that exposes a second bonding pad region may be formed on the third insulating layer 212*c*.

In example embodiments, the third insulating layer 212*c* may be formed on the second insulating layer 212*b* and may have a third opening that exposes the second redistribution wiring 222*b*. The third redistribution wiring 222*c* may be formed on the third insulating layer 212*c* and may contact the second redistribution wiring 222*b* through the third opening.

Although it is not illustrated in the figures, before forming the photoresist pattern 82, a seed layer for forming the second bonding pad may be formed on the third insulating layer 212*c*. The photoresist pattern 82 may be formed on the third insulating layer 212*c*, and the opening 83 may expose the seed layer region on the third redistribution wiring 222*c*.

Figure 25:
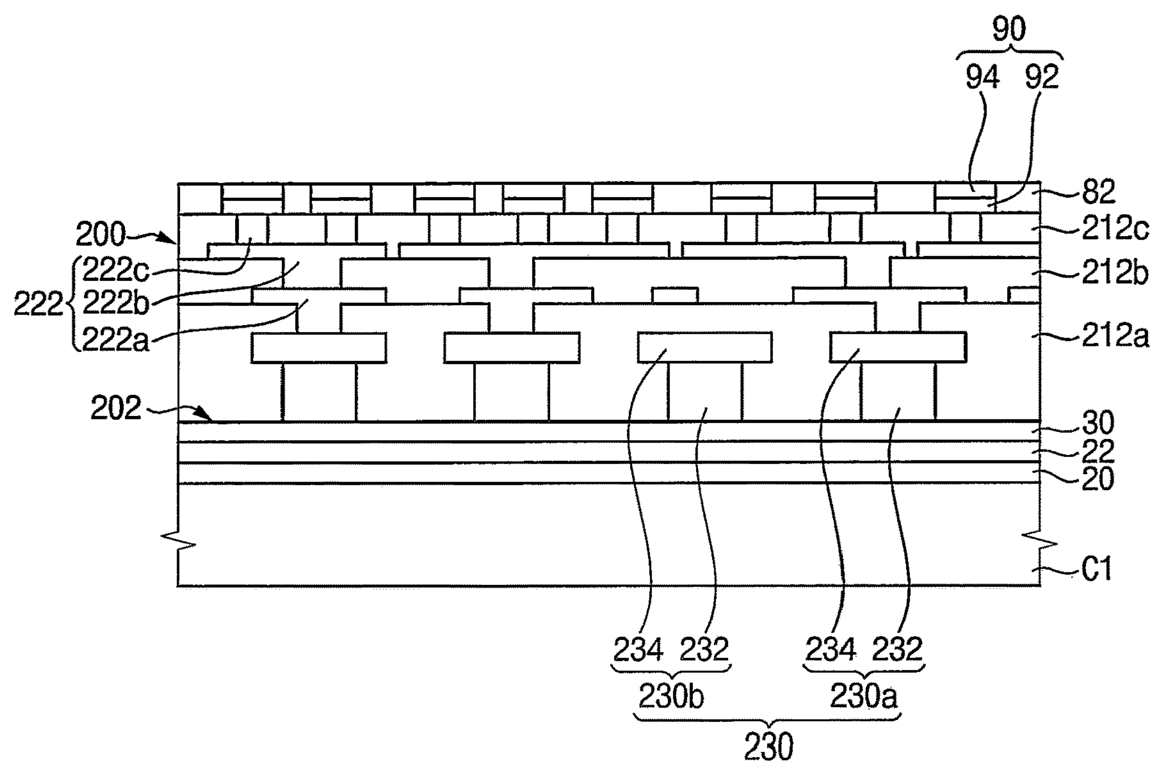

Referring to FIG. 25, a third metal pattern 92 including a third metal material and a fourth metal pattern 94 including a fourth metal material different from the third metal material may be formed on the third redistribution wiring 222*c*.

In example embodiments, a third plating process may be performed on the seed layer 30 to form the third metal pattern 92, and a fourth plating process may be performed on the third metal pattern 92 to form the fourth metal pattern 94.

The third and fourth plating processes may include an electro plating process or an electroless plating process. For example, the third metal material may include nickel (Ni), molybdenum (Mo), titanium (Ti), gold (Au), silver (Ag), chromium (Cr), tin (Sn) and/or an alloy thereof. The fourth metal material may include copper (Cu), aluminum (Al), titanium (Ti) and/or an alloy thereof. The third metal material may include the same material as the seed layer. The fourth metal material may include a material having an etch selectivity with respect to the third metal material. In a subsequent etching process for partially removing the fourth metal pattern and the plating layer, an etch rate of the fourth metal material may be greater than an etch rate of the third metal material.

Figure 26:
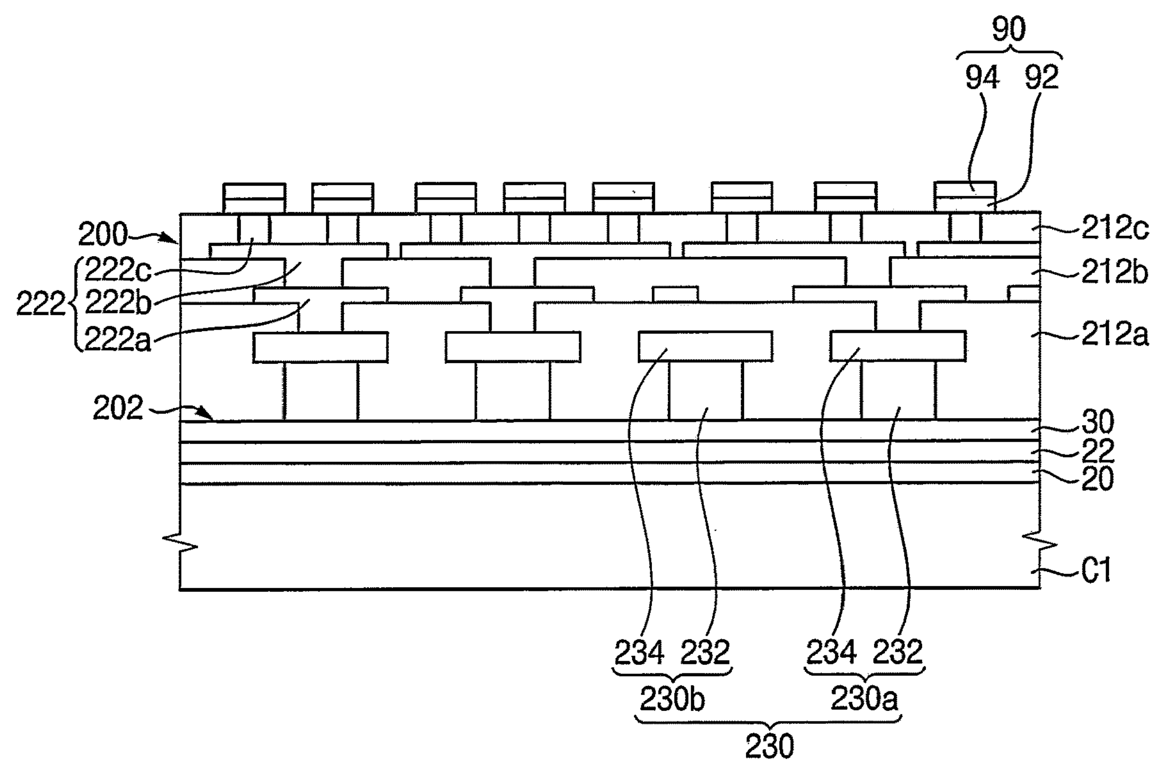

Referring to FIG. 26, the photoresist pattern 82 may be removed to form a preliminary bonding pad 90 including the third and fourth metal patterns 92, 94 on the seed layer.

Figure 27:
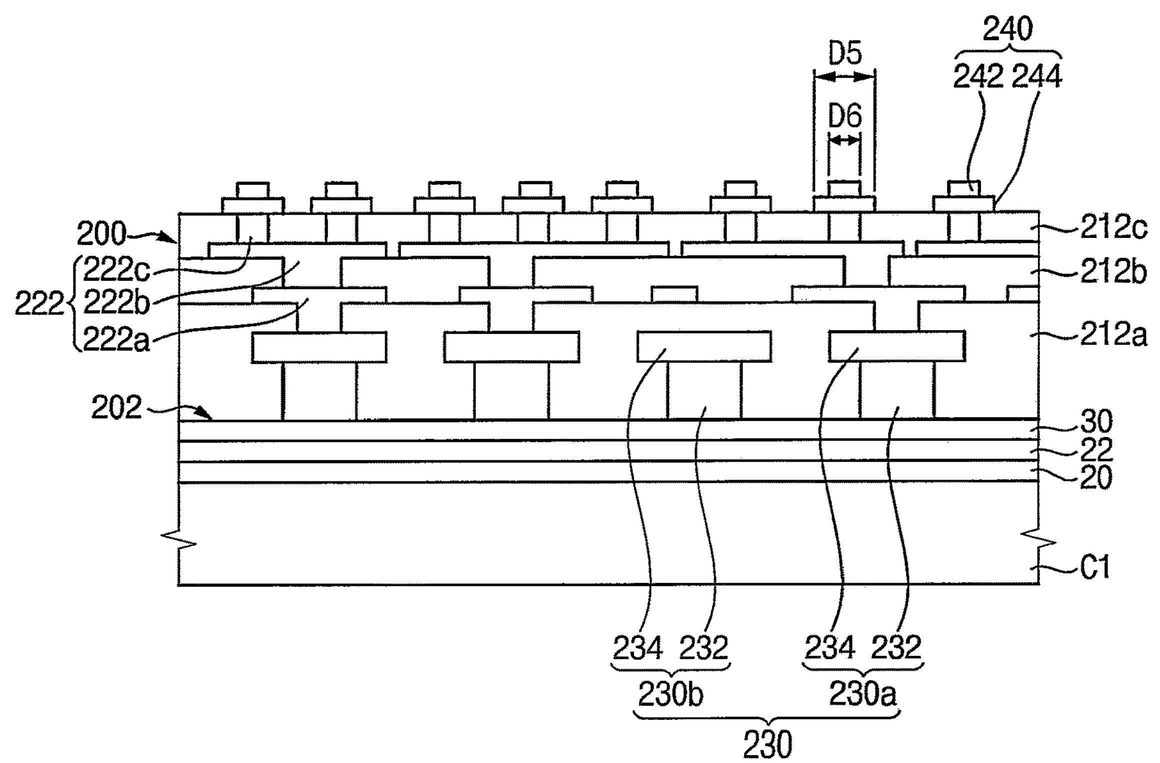

Referring to FIG. 27, a portion of the fourth metal pattern 94 may be selectively removed to form a third pad pattern 242. The portion of the fourth metal pattern 94 may be removed by a wet etching process. In some example embodiments, portions of the seed layer exposed by the third metal patterns 92 may be removed together.

The wet etching process may be performed using an etchant having an etch selectivity with respect to the third metal pattern 92. Accordingly, the third metal pattern 92 may not be removed by the wet etching process, but a portion of a sidewall of the fourth metal pattern 94 and the portions of the exposed seed layer may be removed. Thus, a plurality of the second bonding pads 240 that include the third pad pattern 242 as a third pad portion having the third width D5 and a fourth pad pattern 244 as a second pad portion having the fourth width D6 greater than the third width D5 may be formed.

Figure 28:
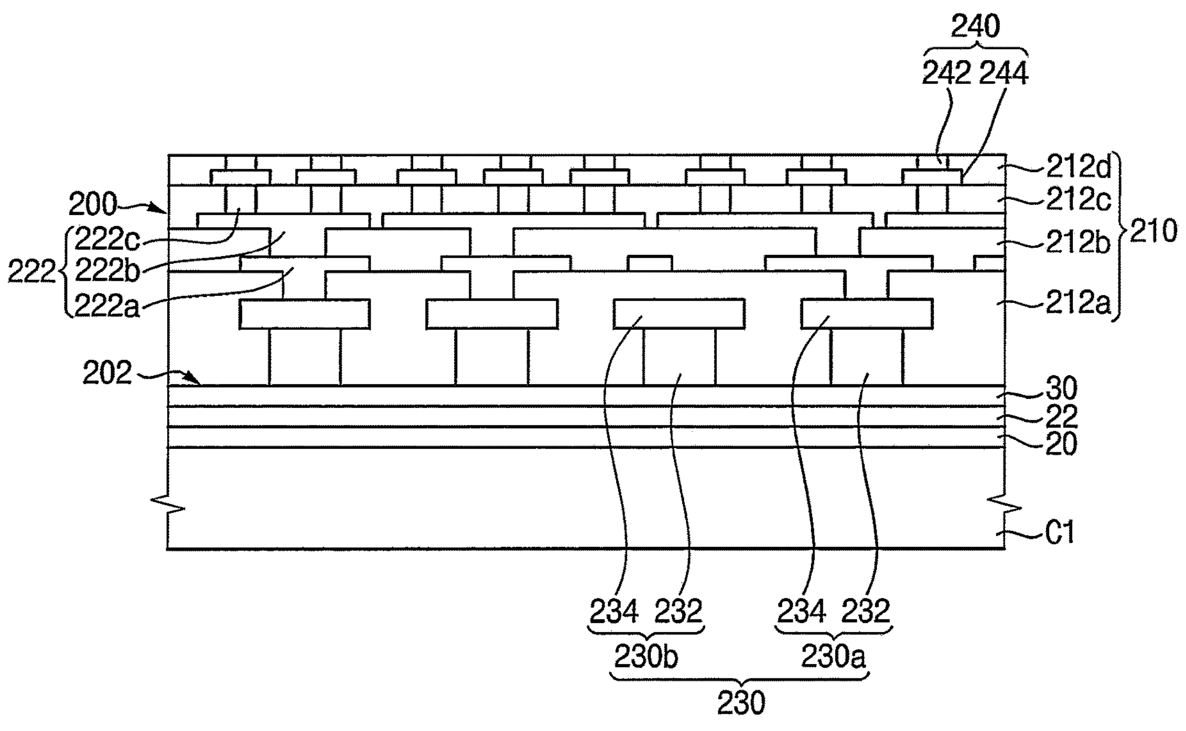

Referring to FIG. 28, a fourth insulating layer 212*d* may be formed on the third insulating layer 212*c*. The fourth insulating layer 212*d* may cover side surfaces of the second bonding pads 240 and expose an upper surface of the third pad pattern 242.

Figure 29:
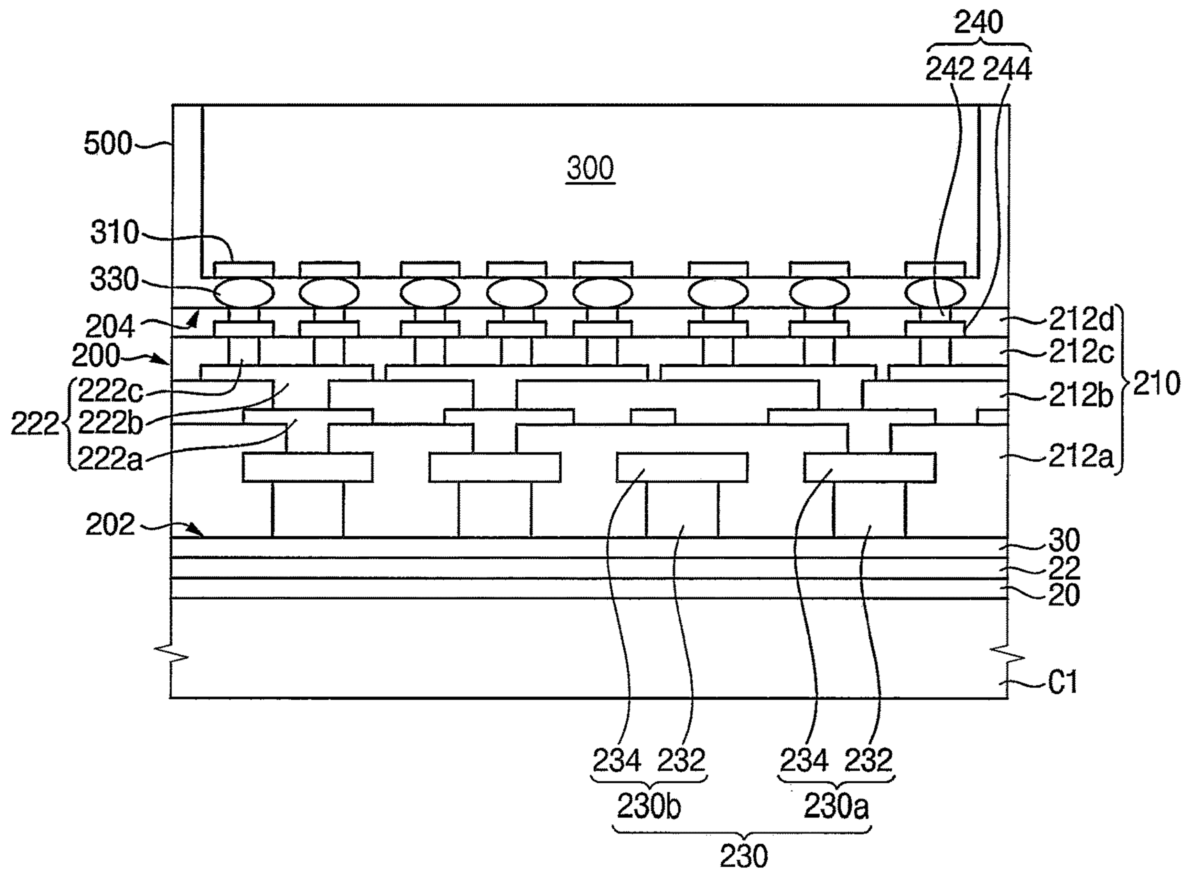

Referring to FIG. 29, processes the same as or similar to the processes described with reference to FIG. 15 may be performed to mount the first semiconductor device 300 and the second semiconductor device 400 (e.g., as described above in relation to FIG. 21) on the redistribution wiring layer 210, and then a sealing member 500 may be formed on the redistribution wiring layer 210 to cover the first semiconductor device 300 and the second semiconductor device by The first semiconductor device 300 and the second semiconductor device 400 may be arranged on the redistribution wiring layer 210 to be spaced apart (e.g., isolated from direct contact with) from each other.

In example embodiments, the first and second semiconductor devices may be mounted on the redistribution wiring layer 210 in a flip chip bonding manner. Chip pads 310 of the first semiconductor device 300 may be electrically connected to the third pad patterns 242 of the second bonding pads 240 of the redistribution wiring layer 210 by the conductive bumps 330. The chip pads 410 (See FIG. 1) of the second semiconductor device may be formed by conductive bumps 430 (See FIG. 1) and the third pad patterns 242 of the second bonding pads 240 of the redistribution wiring layer 210 and may be electrically connected. For example, the conductive bumps 330, 430 may include micro bumps (uBump).

Subsequently, processes the same as or similar to the processes described with reference to FIGS. 16 to 19 may be performed to cut the redistribution wiring layer 210 to form the interposer 200, and then, the interposer 200 may be disposed (e.g., stacked) on a package substrate 100 (e.g., as seen in FIG. 21) to complete the semiconductor package 11 in FIG. 21.

Figure 30:
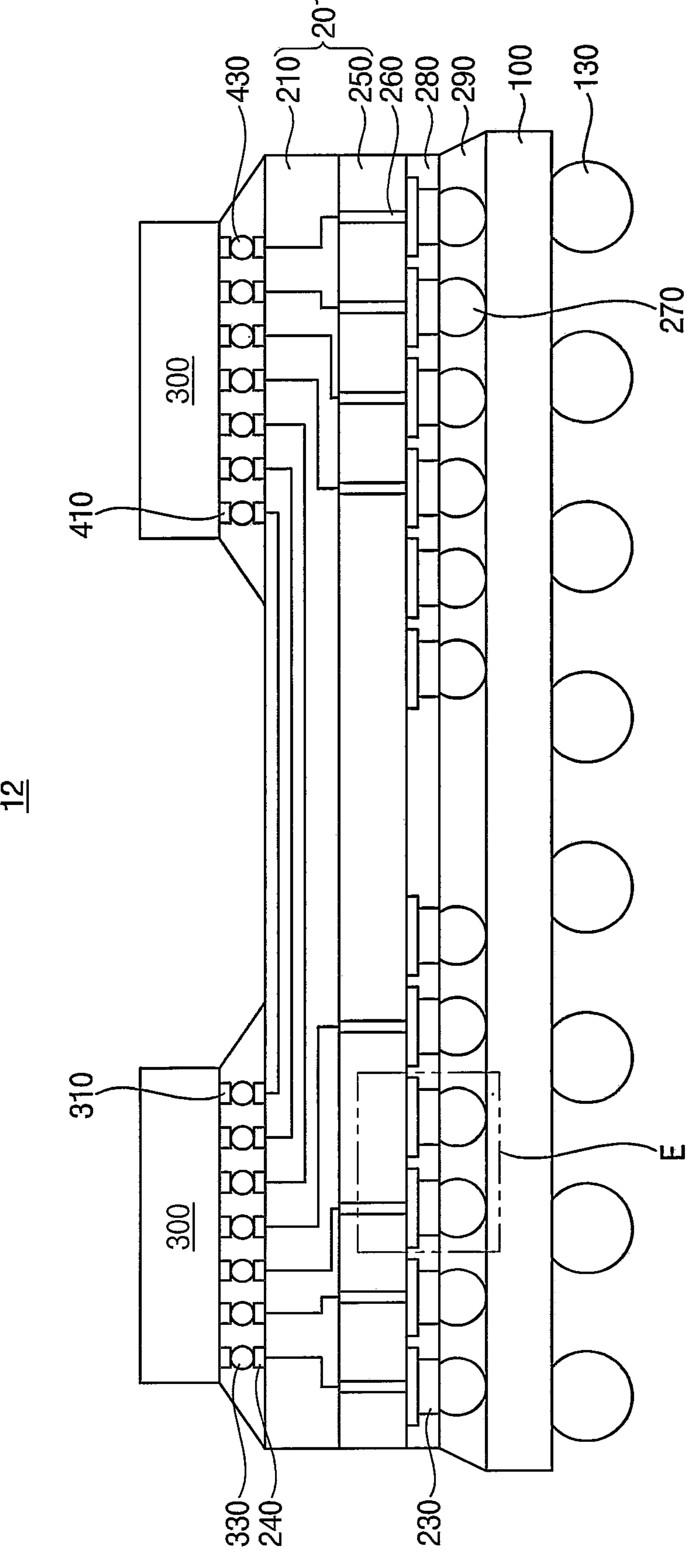
Figure 31:
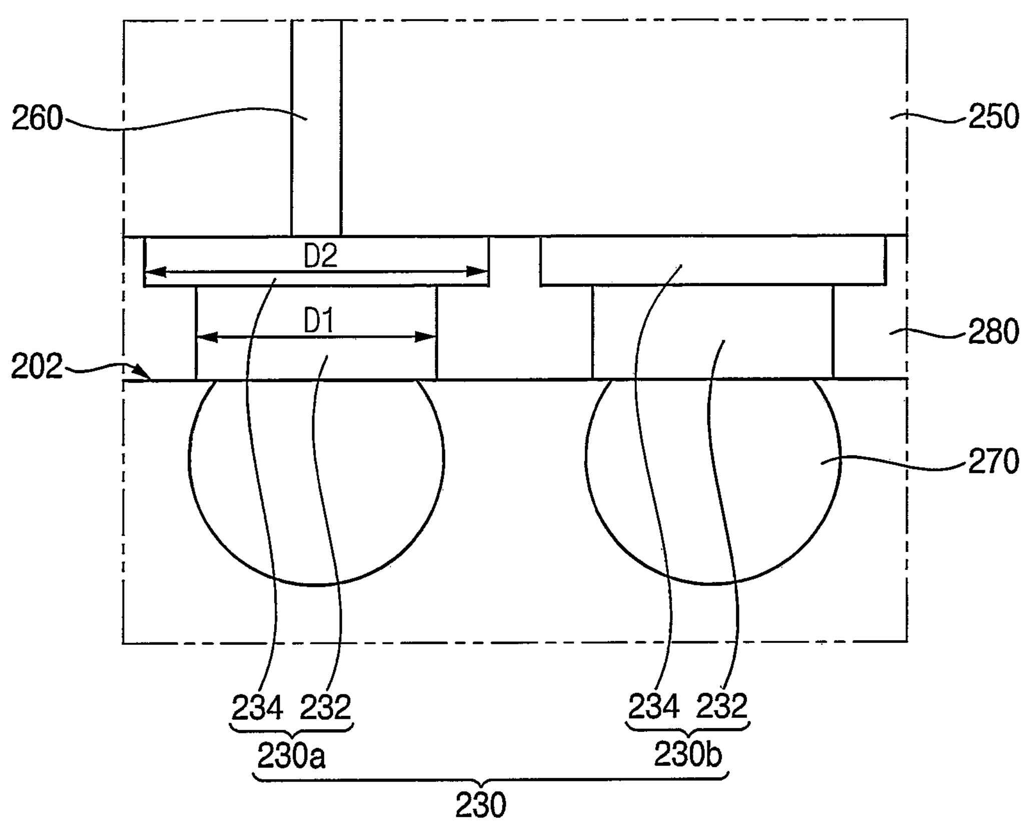

FIG. 30 is a cross-sectional view illustrating a semiconductor package in accordance with example embodiments. FIG. 31 is an enlarged cross-sectional view illustrating portion 'E' in FIG. 30. The semiconductor package may be substantially the same as or similar to the semiconductor package described with reference to FIGS. 1 to 3 except for a configuration of a silicon interposer. Thus, same or similar components may be denoted by the same or similar reference numerals, and repeated descriptions of the same components will be omitted.

Referring to FIGS. 30 and 31, an interposer 201 of a semiconductor package 12 may include a silicon interposer. The interposer 201 may include a semiconductor substrate 250 and a redistribution wiring layer 210 having a plurality of redistribution wirings 222 on an upper surface of the semiconductor substrate 250.

In example embodiments, the semiconductor substrate 250 may include a plurality of through electrodes 260 formed to penetrate therethrough. The through electrode 260 may include a through silicon via (TSV). The through electrode 260 may be provided to vertically penetrate the semiconductor substrate 250. One end of the through electrode 260 may be electrically connected to the redistribution wiring 222 of the redistribution wiring layer 210.

In example embodiments, a first bonding pad 230 may be provided to be exposed from a first surface 202 of the interposer 200. The first bonding pad 230 may be disposed (e.g., stacked) on a lower surface of the semiconductor substrate 250.

The first bonding pad 230 may have a first pad pattern 232 having a first width D1 and a second pad pattern 234 having a second width D2 greater than the first width D1 on the first pad pattern 232.

For example, the first width D1 of the first pad pattern 232 may be within a range of about 10 μm to about 800 μm, and the second width D2 of the second pad pattern 234 may be within a range of about 10 μm to about 800 μm. A difference D3 between the second width D2 of the second pad pattern 234 and the first width D1 of the first pad pattern 232 may be within a range of about 0.1 μm to about 2 μm.

An insulating layer pattern 280 may be formed on the lower surface of the semiconductor substrate 250. The insulating layer pattern 280 may cover side surfaces of the first bonding pads 230 and expose a lower surface of the first pad pattern 232.

As illustrated in FIG. 31, the second pad pattern 234 of a first connection pad 230*a* may be electrically connected to one end of the through electrode 260, while the second pad pattern 234 of a first dummy pad 230*b* may not be electrically connected to the through electrode 260. Other configurations and functions of the first bonding pad 230 may be substantially the same as or similar to those described with reference to FIG. 1. Thus, detailed descriptions thereof will be omitted.

The above-described semiconductor package may include a semiconductor device such as a logic device or a memory device. The semiconductor package may include a logic device such as a central processing unit (CPU, MPU), an application processor (AP), e.g., a volatile memory device such as an SRAM device or a DRAM device, or, a non-volatile memory device such as a flash memory device, a PRAM device, an MRAM device, or an RRAM device.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the inventive concepts as set forth in the following claims.

What is claimed is:

1. A method of manufacturing an interposer, the method comprising:

forming a plurality of first bonding pads on a first surface, each of the plurality of first bonding pads including a first pad pattern having a first width and a second pad pattern disposed on the first pad pattern and having a second width greater than the first width, the first surface under the second pad pattern being exposed;

forming a first insulation layer covering and surrounding the first pad pattern and the second pad pattern of each of the plurality of first bonding pads, the first insulation layer having a plurality of first openings that respectively expose at least portions of the second pad patterns, the first insulation layer being a single layer with a bottommost surface coplanar with a bottommost surface of the plurality of the first bonding pads and a height greater than a height of the plurality of first bonding pads;

forming first redistribution wirings on the first insulation layer, wherein the first redistribution wirings are electrically connected to the second pad patterns through the plurality of first openings, respectively;

forming a redistribution wiring layer on the first insulation layer, wherein the redistribution wiring layer includes a second insulation layer covering the first insulation layer and second redistribution wirings that are electrically connected to the first redistribution wirings through a plurality of second openings in the second insulation layer, respectively; and mounting a first semiconductor device and a second semiconductor device on the redistribution wiring layer.

2. The method of claim 1, wherein forming the plurality of first bonding pads includes, sequentially forming a seed layer and a photoresist film on a carrier;

forming a plurality of third openings in the photoresist film to respectively expose portions of the seed layer;

performing a first plating process in the plurality of third openings to form a plurality of first metal patterns including a first metal material;

performing a second plating process on the plurality of first metal patterns to form a plurality of second metal patterns including a second metal material; and partially removing side portions of each of the plurality of first metal patterns to form the plurality of first bonding pads having a T-shape.

3. The method of claim 2, wherein partially removing the side portions of each of the plurality of first metal patterns includes performing an etch process using an etchant that has an etching rate of the first metal material greater than an etching rate of the second metal material.

4. The method of claim 2, wherein the first metal material includes at least one of copper, aluminum, and titanium, and the second metal material includes at least one of nickel, molybdenum, titanium, gold, silver, chromium, and tin.

5. The method of claim 2, wherein forming the interposer further includes, before partially removing the plurality of first metal patterns, removing the photoresist film to expose portions of the seed layer, side portions of the plurality of first metal patterns and the plurality of second metal patterns.

6. The method of claim 1, further comprising:

forming a plurality of second bonding pads on the redistribution wiring layer.

7. The method of claim 6, wherein each of the plurality of second bonding pads includes a third pad pattern having a third width and a fourth pad pattern disposed on the third pad pattern and having a fourth width less than the third width.

8. The method of claim 6, wherein forming the plurality of second bonding pads includes, forming a photoresist pattern having a plurality of fourth openings that respectively expose the second redistribution wirings;

performing a third plating process in the plurality of fourth openings to form a plurality of third metal patterns including a third metal material;

performing a fourth plating process on a plurality of first metal patterns to form a plurality of fourth metal patterns including a fourth metal material; and partially removing side portions of each of the plurality of fourth metal patterns.

9. The method of claim 8, wherein partially removing the side portions of each of the plurality of fourth metal patterns includes performing an etch process using an etchant that has an etching rate of the fourth metal material greater than an etching rate of the third metal material.

10. The method of claim 1, wherein the first pad pattern has a first thickness, and the second pad pattern has a second thickness less than the first thickness.

11. A method of manufacturing a semiconductor package, the method comprising:

forming an interposer having a plurality of first bonding pads on a first surface of the interposer and a plurality of second bonding pads on a second surface of the interposer, the first surface being opposite to the second surface;

forming a plurality of solder bumps on the plurality of first bonding pads on the first surface of the interposer, respectively; and mounting a plurality of semiconductor devices on the plurality of second bonding pads on the second surface of the interposer, wherein forming the interposer includes, sequentially forming a seed layer and a photoresist film on a carrier;

forming a plurality of first openings in the photoresist film to respectively expose portions of the seed layer;

performing a first plating process in the plurality of first openings to form a plurality of first metal patterns including a first metal material performing a second plating process on the plurality of first metal patterns to form a plurality of second metal patterns including a second metal material; and partially removing side portions of each of the plurality of first metal patterns to form the plurality of first bonding pads, each of the plurality of first bonding pads having a first pad pattern and a second pad pattern, wherein the first pad pattern includes the first metal material and the second pad pattern includes the second metal material.

12. The method of claim 11, wherein partially removing the side portions of each of the plurality of first metal patterns includes performing an etch process using an etchant that has an etching rate of the first metal material greater than an etching rate of the second metal material.

13. The method of claim 11, wherein the first pad pattern has a first width and the second pad pattern has a second width greater than the first width.

14. The method of claim 11, wherein the first metal material includes at least one of copper, aluminum, and titanium, and the second metal material includes at least one of nickel, molybdenum, titanium, gold, silver, chromium, and tin.

15. The method of claim 11, wherein forming the interposer further includes, before partially removing the side portions of each of the plurality of first metal patterns, removing the photoresist film to expose portions of the seed layer, side portions of each of the plurality of first metal patterns and the plurality of second metal patterns.

16. The method of claim 11, wherein forming the interposer further includes, forming a first insulation layer on the carrier, the first insulation layer covering the plurality of first bonding pads and having a plurality of second openings that respectively expose at least portions of the second pad patterns; and forming a plurality of redistribution wirings on the first insulation layer, each of the plurality of redistribution wirings being electrically connected to the second pad patterns through the plurality of second openings.

17. The method of claim 16, wherein forming the interposer further includes, forming the plurality of second bonding pads on the plurality of redistribution wirings.

18. The method of claim 17, wherein forming the plurality of second bonding pads includes, forming a photoresist pattern having a plurality of third openings that expose the plurality of redistribution wirings;

performing a third plating process in the plurality of third openings to form a plurality of third metal patterns;

performing a fourth plating process on the plurality of third metal patterns to form a plurality of fourth metal patterns; and partially removing the side portions of each of the plurality of fourth metal patterns.

19. The method of claim 11, wherein the first pad pattern has a first thickness, and the second pad pattern has a second thickness less than the first thickness.

20. A method of manufacturing an interposer, the method comprising:

sequentially forming a seed layer and a photoresist film on a carrier;

forming a plurality of first openings in the photoresist film to respectively expose portions of the seed layer;

performing a first plating process on the portions of the seed layer exposed by the plurality of first openings to form a plurality of first metal patterns including a first metal material;

performing a second plating process on the plurality of first metal patterns to form a plurality of second metal patterns including a second metal material;

removing the photoresist film to expose portions of the seed layer and side portions of each of the plurality of first metal patterns and the plurality of second metal patterns;

partially removing side portions of each of the plurality of first metal patterns to form a plurality of first bonding pads, each of the plurality of first bonding pads having a first pad pattern and a second pad pattern, wherein the first pad pattern includes the first metal material and the second pad pattern includes the second metal material;

forming a first insulation layer on the carrier, the first insulation layer covering the plurality of first bonding pads and having a plurality of second openings that respectively expose at least portions of the second pad patterns;

forming a redistribution wiring layer on the first insulation layer, wherein the redistribution wiring layer includes a plurality of redistribution wirings that are electrically connected to the second pad patterns through the plurality of second openings; and mounting a first semiconductor device and a second semiconductor device on the redistribution wiring layer.

* * * * *